(12) United States Patent
Yamashita et al.

(10) Patent No.: US 6,445,203 B1
(45) Date of Patent: *Sep. 3, 2002

(54) ELECTRIC DEVICE TESTING APPARATUS

(75) Inventors: Tsuyoshi Yamashita; Yoshihito Kobayashi; Toshiyuki Kiyokawa; Hiroto Nakamura; Noriyuki Igarashi; Kenichi Shimada, all of Tokyo (JP)

(73) Assignee: Advantest Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/456,408

(22) Filed: Dec. 8, 1999

(30) Foreign Application Priority Data

Dec. 8, 1998 (JP) .......................... 10-348278
Dec. 9, 1998 (JP) .......................... 10-349790
Dec. 9, 1998 (JP) .......................... 10-349791

(51) Int. Cl.$^7$ ............................................. G01R 31/02
(52) U.S. Cl. ................................................... 324/760
(58) Field of Search ................................. 324/760, 755, 324/758

(56) References Cited

U.S. PATENT DOCUMENTS

| 5,029,418 | A | * | 7/1991 | Bull .......................... 51/281 R |
| 5,198,752 | A | * | 3/1993 | Miyata et al. ........... 324/158 F |
| 5,541,524 | A | * | 7/1996 | Tuckerman et al. ......... 324/754 |
| 6,147,506 | A | * | 11/2000 | Ahmad et al. .............. 324/760 |
| 6,181,145 | B1 | * | 1/2001 | Tomita et al. .............. 324/754 |

* cited by examiner

Primary Examiner—N. Le
Assistant Examiner—Etienne P LeRoux
(74) Attorney, Agent, or Firm—Birch, Stewart, Kolasch & Birch, LLP

(57) ABSTRACT

An electric device testing apparatus comprises a connection terminal to which an IC chip to be tested is removably connected, a pusher for pushing the IC chip in the direction of the connection terminal in order to connect the IC chip to the connection terminal, and temperature adjusted air supply for blowing a temperature adjusted air to around the IC chip during a test on the IC chip via a through hole formed on the pushed.

22 Claims, 23 Drawing Sheets

ELECTRIC DEVICE TESTING APPARATUS

BACKGROUND OF THE INVENTION

1. Field of the Invention

The present invention relates to an electric device testing apparatus for testing an electric device, such as an IC chip, under a predetermined temperature, more specifically relates to an electric device testing apparatus which can always maintain the temperature around the electric device at a set temperature even when the electric device itself generates heat during the test and perform testing electric devices at a desired set temperature with a high credibility.

2. Description of the Related Art

A testing apparatus for testing a finally produced device, such as an IC chip, is necessary in a producing process of a semiconductor device, etc. As one kind of such testing apparatuses, an apparatus for testing an IC chip under applying a thermal stress of a high temperature, a normal temperature and a lower temperature than a normal temperature is known. It is because IC chips are required to guarantee as a feature thereof to operate well under a high, normal and low temperature.

A test is carried out in such a testing apparatus, wherein an upper portion of its test head is covered with a chamber for providing a sealed space, an IC chip is conveyed to above the test head, where the IC chip is pushed against the test head for connection, and inside the chamber is maintained at a high, normal or low temperature condition within a constant temperature range. The IC chips are preferably tested by the above test and sorted into at least good ones and defective ones.

Along with the recent IC chips becoming higher to speed and more highly integrated, however, the heat generation by itself during operating has become higher and heat is generated by itself also during the IC chip testing. Even when inside the chamber is maintained at a constant temperature, it has become difficult to carry out the test on an IC chip under the original temperature of the test. For example, some generates about 30 watts of heat by itself depending on kinds of the IC chips.

When testing an IC chip which generates such high heat by itself, the temperature around the IC chip rises due to the self heating even if inside the chamber is made to be at a constant temperature, so it becomes difficult to carry out a test on the IC chip under a determined testing temperature. When a test of an IC chip cannot be carried out under a determined testing temperature, it gives a problem that reliability of the test declines.

Especially, when the self heating of an IC chip is high in a high temperature test, assuming that though a set temperature inside a chamber is 80° C., the actual temperature on the IC chip device becomes 90° C. Thus, the temperature on the device becomes rather higher than the set temperature. Also, when a high temperature test of about 125° C. is carried out, for example, the quantity of heat by the self heating in addition to that of the set temperature is applied to the IC chip, as a result, there arises a possibility that the temperature on the IC chip exceeds its tolerable limit.

Thus, in the related art, a correction value (10° C.) is determined in advance by expecting the self heating of the IC chip to set the set temperature of inside the chamber at 70° C., which is 10° C. lower than the test temperature of 80° C. in the specification. By doing so, tests have been carried out assuming that the temperature on the IC chip during the test is set at 80° C. as in the test specification.

However, when the self heating is very high due to high integration of an IC chip or when a test time is long, it is difficult to determine the correction value in advance and to precisely control the test temperature of a device under the test, such as an IC chip.

SUMMARY OF THE INVENTION

An object of the present invention is to provide an electric device testing apparatus which can always maintain the temperature around the electric device at a set temperature even if the electric device under testing generates heat by itself during the test so as to carry out a test on the electric device under a desired temperature with high credibility, and furthermore, prevent the electric device from being damaged.

(1) To attain the above object, according to a first aspect of the present invention, there is provided an electric device testing apparatus comprising:

a connection terminal to which an electric device to be tested is removably connected;

a pusher for pushing the electric device against said connection terminal in order to connect the electric device to said connection terminal;

and a means for adjusting a temperature of the electric device during a test on said electric device via a hole formed on said pusher.

(1-1) In this case, it is preferable that the hole includes a ventilation hole formed on said pusher, and the temperature adjusting means includes a temperature adjusted gas supply means for blowing a temperature adjusted gas to around said electric device during the test on the electric device.

Also, it is preferable that the temperature adjusted gas supply means includes a temperature ventilation amount control means for controlling the temperature of the temperature adjusted gas and/or the ventilation amount to be supplied around the electric device during the test on the electric device based on temperature data from a temperature sensor.

Also, it is preferable that the temperature adjusted gas supply means includes a dry means for previously drying the temperature adjusted gas to be supplied around the electric device.

Furthermore, it is preferable that the electric device testing apparatus according to the present invention further comprises a sealed chamber for covering said connection terminal, pusher and electric device as one.

Also, it is preferable that the temperature adjusted gas to be supplied around the electric device from the temperature adjusted gas supply means is an air taken out from a part of the air inside said chamber and being adjusted its temperature.

When performing a high temperature test, normal temperature test, or low temperature test on an electric device, such as an IC chip, the electric device becomes high temperature due to its self-heating and the temperature around the electric device becomes higher than a set temperature in a usual case. However, in an electric device testing apparatus according to the present invention, a temperature adjusted gas is directly blown around the electric device via a ventilation hole formed on a pusher. The temperature adjusted gas is, for example, a dry air and set, for example, at a temperature specified in the test specification, or at a temperature of being added a control value to the temperature. For example, when the test specification specifies a high temperature test of 80° C., the temperature adjusted air is at 80° C. or less in order to maintain the electric device under the test at 80° C. and blown directly around the electric device. Note that during the test, by detecting the temperature on the electric device, the temperature and/or amount of the temperature adjusted gas are adjusted so that the electric device becomes at the temperature specified in the test specification. The adjustment of the temperature and/or the blowing amount are preferably performed for individual electric device. It is because even if the electric devices to be tested are all identical, the temperature may vary depending on the position of the electric device inside the chamber.

As explained above, an electric device testing apparatus according to the present invention, electric devices are always tested under a condition close to a set temperature (temperature specified in a test specification), and the reliability of the test improves.

In the above invention, it is preferable that the pusher is provided with a temperature sensor capable of detecting an temperature of the electric device and/or an atmosphere temperature around the electric device.

By detecting by the temperature sensor the temperature on the electric device and/or the atmosphere temperature around the electric device and controlling the temperature and/or blowing amount of the blowing gas based on the temperature data from the temperature sensor, temperature controlling can be stable and uniform, unnecessary blowing (ventilation) is eliminated, and it contributes to energy saving.

(1-2) Furthermore, it is preferable that the hole includes a drawing hole formed on the pusher, and the temperature adjusting means includes an air drawing means for drawing an air around the electric device during the test on the electric device.

In this case, it is preferable that the drawing means includes a drawing amount control means for controlling the drawing amount of the air around the electric device during the test on the electric device based on the temperature data from the temperature sensor.

Also, it is preferable that the electric device testing apparatus according to the present invention further comprises a chamber for maintaining the atmosphere temperature constant around the connection terminal to which said electric device is removably connected.

When performing a high temperature test, normal temperature test, or low temperature test on an electric device, such as an IC chip, the electric device becomes high temperature due to its self-heating and the temperature around the electric device becomes higher than a set temperature in a usual case. However, in an electric device testing apparatus according to the present invention, the atmosphere gas around the electric device which has become a higher temperature than a set temperature due to the self-heating is drawn by a drawing means. Therefore, the atmosphere gas around the electric device is always drawn to be discharged and the heat caused by the self-heating is taken away, and an air adjusted to be the set temperature is flown around the electric device, instead. As a result, the electric device is always tested under the condition close to a set temperature and the reliability of the test improves.

In the above invention, it is preferable that the pusher is provided with a temperature sensor capable of detecting an temperature of the electric device and/or an atmosphere temperature around the electric device.

By detecting by the temperature sensor the temperature on the electric device and/or the atmosphere temperature around the electric device and controlling the drawing amount based on the temperature data from the temperature sensor, temperature controlling can be stable and uniform, unnecessary blowing(ventilation) is eliminated, and it contributes to energy saving.

(1-3) The above invention can be implemented as an electric device testing apparatus comprising:

an adaptor to which the pusher is fixed;

a match plate for elastically holding the adaptor;

and a drive plate having a pushing portion for detachably contacting the upper surface of the adaptor and for moving the pusher in the direction of the connection terminal; and wherein:

the match plate is arranged on the connection terminal changeably in accordance with a kind of the electric device;

the drive plate is arranged movably upward and downward at the upper portion of the match plate; and a first hole formed on the pusher is configured to be connected to a second hole formed on the adaptor, and the second hole formed on the adaptor is configured to be able to connect to a third hole formed on a pushing portion of the drive plate.

In this case, it is preferable that the sealing member for sealing a connection portion of the holes to each other is provided to a contact portion of the pushing portion of the drive plate and the adaptor.

(2) To attain the above object, according to the second aspect of the present invention, there is provided an electric device testing apparatus, comprising: a suction head for picking up an electric device; a suction force giving means for giving the suction force to said suction head; and a suction force crushing means for releasing the suction force of said suction head; for performing a test by pushing a terminal of said electric device to be tested against a connection terminal of a test head;

and for blowing fluid for releasing the suction force of said suction head on the electric device pushed against the suction head for any period of time during the test on the electric device.

When releasing the electric device picked up by the suction head, it is often the case that the electric device is not smoothly released only by stopping applying the suction force. This problem becomes more obvious when the electric device is smaller and lighter. Therefore, there is provided a suction force crush means for releasing the suction force on the electric device held by the suction head by coercively flows the fluid for suction, such as an air, backward, as a result, the electric device can be smoothly released.

In the present invention, by utilizing the suction force crush means, since the fluid for releasing the suction force of the suction head on the electric device to be tested which is pushed against the suction head exactly for at least any period of time during the test, the self-heating generated during the test can be released. As a result, it is possible to prevent the electric device from being broken or damaged due to excessive heating, which is especially regarded as a problem in a high temperature test.

Furthermore, raising of the temperature by self-heating is suppressed by blowing a fluid, it is not limited to a high temperature test, but a test can be performed at a desired accurate temperature and the reliability of the test results improves.

(2-1) In the above invention, though it is not specifically limited, it is preferable that the electric device testing apparatus further comprises a chamber for maintaining the atmosphere temperature constant around the connection terminal.

When the present invention is applied to an electric device testing apparatus of a type of applying a predetermined temperature on an electric device by maintaining the atmosphere temperature inside the chamber constant, the above efficiencies become more remarkable.

(2-2) In the above invention, though it is not specifically limited, it is preferable that a suction surface of the suction head is formed a groove in which the fluid can passes through.

The cooling effect on the electric device is promoted by flowing a fluid in the grooves formed on the suction surface, and the above effects of suppressing the temperature rising caused by the self-heating becomes more remarkable. Furthermore, if the effects of suppressing the temperature rising improves, it becomes possible to cool with a small amount of fluid or shorter time of fluid blowing.

(2-3) In the above invention, an operation instruction for blowing the fluid is not specifically limited, however, it is preferable that blowing of the fluid on the electric device is performed by sending an instruction signal from a control means to the suction force crush means.

The suction force giving means and suction force crush means are controlled for picking up to hold or releasing the electric device on or from the suction head. However, by using the control means to control the control in common or by providing another control means, it is possible to blow a fluid.

(2-4) In the above invention, the temperature of the blown fluid is not specifically limited, however, it is preferable that the electric device testing apparatus further comprises a temperature control unit for controlling the fluid to be blown on the electric device to be a predetermined temperature.

By controlling the temperature of the fluid blown to the electric device at a predetermined temperature, the above cooling effects can be more effectively present.

(2-5) In the above invention, the specific configuration of the suction force giving means is not specifically limited, however, it is preferable that the suction force giving means includes a fluid supply source, an ejector connected to the suction head, an ejector valve comprised by the fluid supply source, the ejector and the suction head.

Namely, by supplying a fluid, such as an air, from the fluid supply source to the ejector, the electric device can be held on the suction head. The on/off of the suction force is switched by opening/closing of the ejector valve.

Also, in the above invention, the specific configuration of the suction force crush means is not specifically limited, however, it is preferable that the suction force crush means includes a fluid supply source and a crush valve connected to the fluid supply source and the suction head.

Namely, by supplying a fluid, such as an air, from the fluid supply source to the suction head, since the fluid flows at the suction head in the opposite direction to the suction force, even small light electric devices can be surely and correctly released. The on/off of the releasing is switched by opening/closing of the crush valve.

(2-6) In the above invention, it is not specifically limited, however, it is characterized that the fluid supply source of the suction force giving means and the fluid supply means of the suction force crush means are identical fluid supply means. By this, the fluid supply circuit can be simplified and the cost can be reduced.

Also, it is not specifically limited, however, it is preferable that the fluid to be blown on the electric device is commonly used as fluid applied to the suction force giving means.

(2-7) In the above invention, kinds of the fluid is not specifically limited, however, an air is preferable when considering the easy handling and a low cost.

(3) To attain the above object, according to the third aspect of the present invention, there is provided an electric device testing apparatus comprising a suction head for picking up an electric device, a suction force giving means for giving a suction force to the suction head, and a suction force crush means for releasing the suction force of the suction head; for holding and releasing said electric device; and for blowing fluid on the electric device for releasing the suction force of the suction head when the electric device is held at a fixed position.

In this case, it is preferable that the suction surface of the suction head is formed a groove in which the fluid can pass through.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects and features of the present invention will become clearer from the following description of the preferred embodiments given with reference to the attached drawings which are given by way of illustration only, and thus are not limitative of the present invention, and in which.

DESCRIPTION OF THE PREFERRED EMBODIMENTS

First Embodiment

First, the overall configuration of an electric device testing apparatus as an electric device testing apparatus according to a first embodiment of the present invention will be explained.

Figure 5:
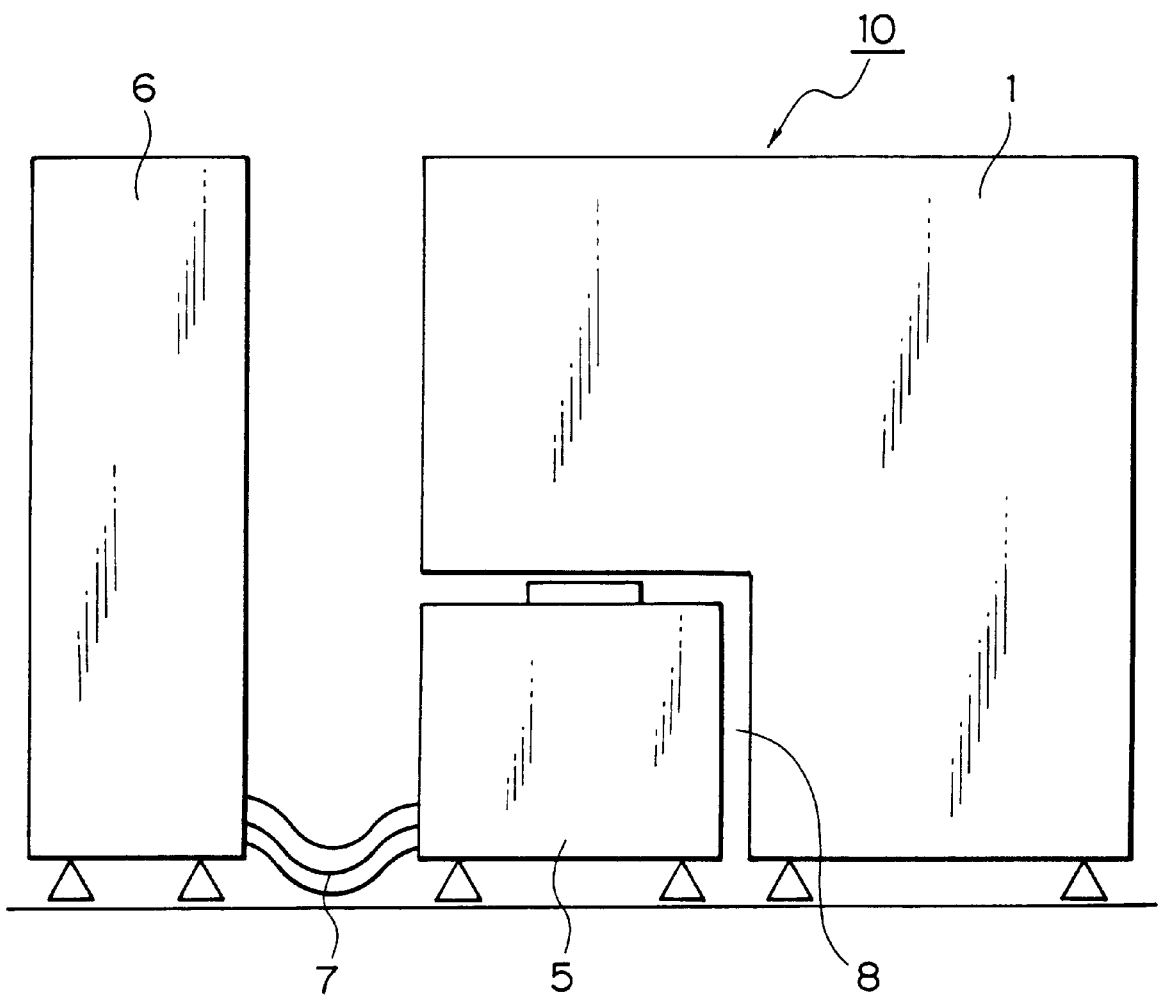
FIG. 5 is an overall sectional view of the electric device testing apparatus.

As shown in FIG. 5, an electric device testing apparatus 10 according to the present embodiment comprises a handler 1, a test head 5 and a testing main device 6.

The handler 1 successively conveys an IC chip to be tested to an IC socket provided on the test head 5 and performs an operation to sort the tested IC chip in accordance with the test result and stock the same to a predetermined tray.

The IC socket provided on the test head 5 is connected to the testing main device 6 via a cable 7, and connects an IC chip detachably mounted on the IC socket to the testing main device 6 via the cable 7, and performs a test on the IC chip by a test signal from the testing main device 6.

At the lower portion of the handler is mainly provided with a control device built therein for controlling the handler 1 but a space portion 8 is provided in a part therein. The test head 5 is changeably arranged in the space portion 8, which makes it possible to mount the IC chip on the IC socket on the test head 5 through a through hole formed on the handler 1.

Figure 1:
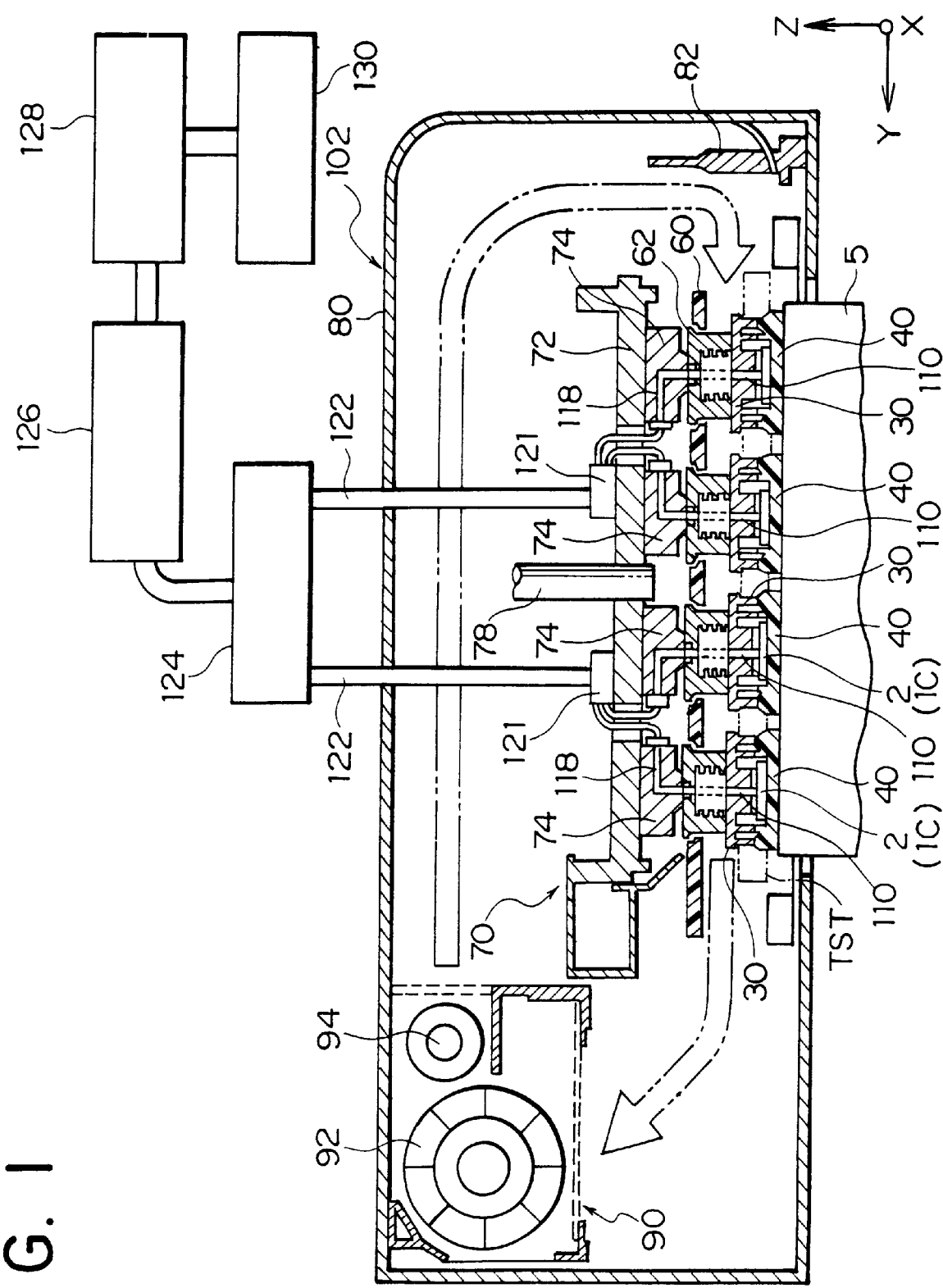
FIG. 1 is a sectional view of a core portion of an electric device testing apparatus according to a first embodiment of the present invention.
Figure 6:
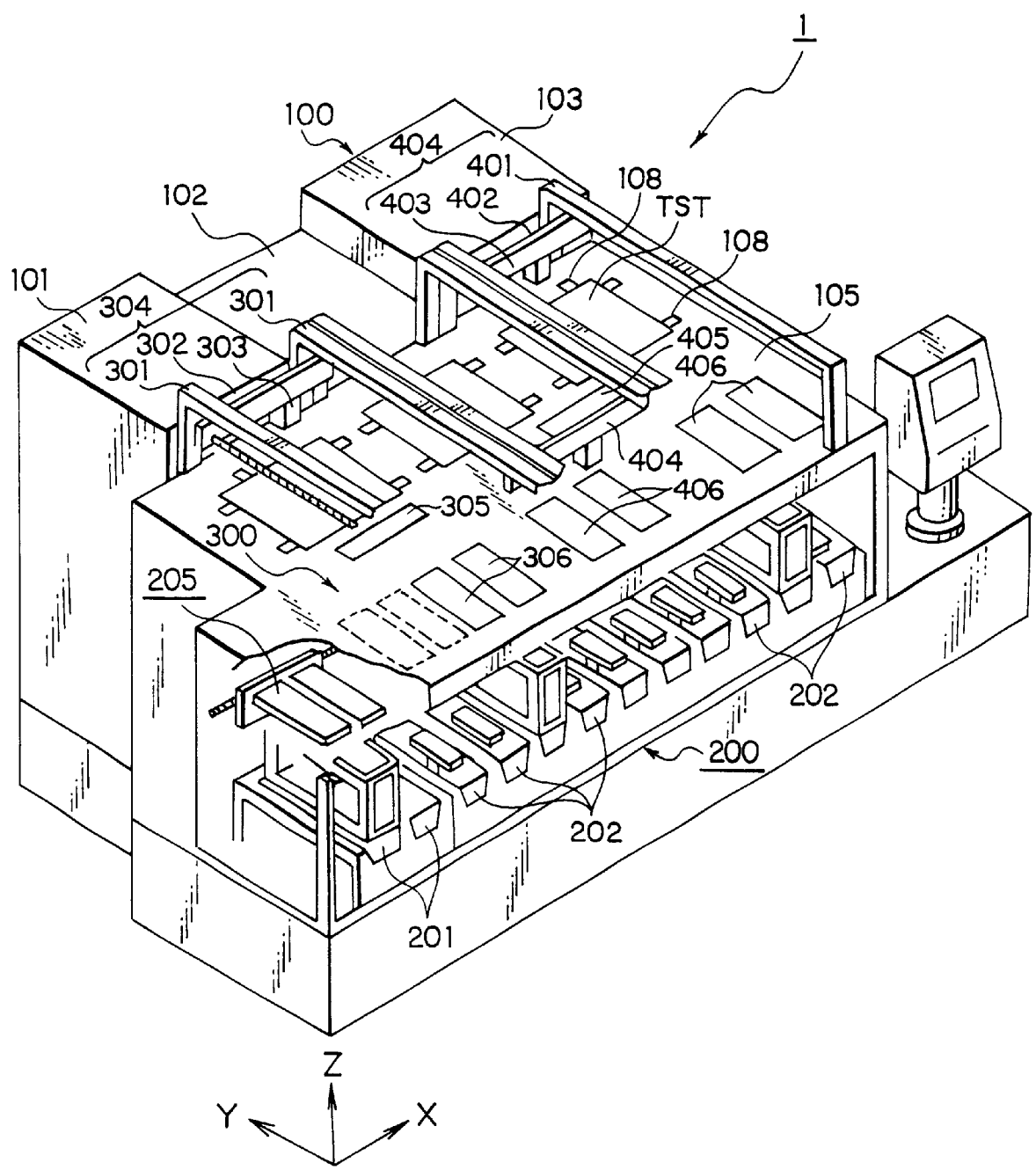
FIG. 6 is a perspective view of a handler shown in FIG. 5.
Figure 7:
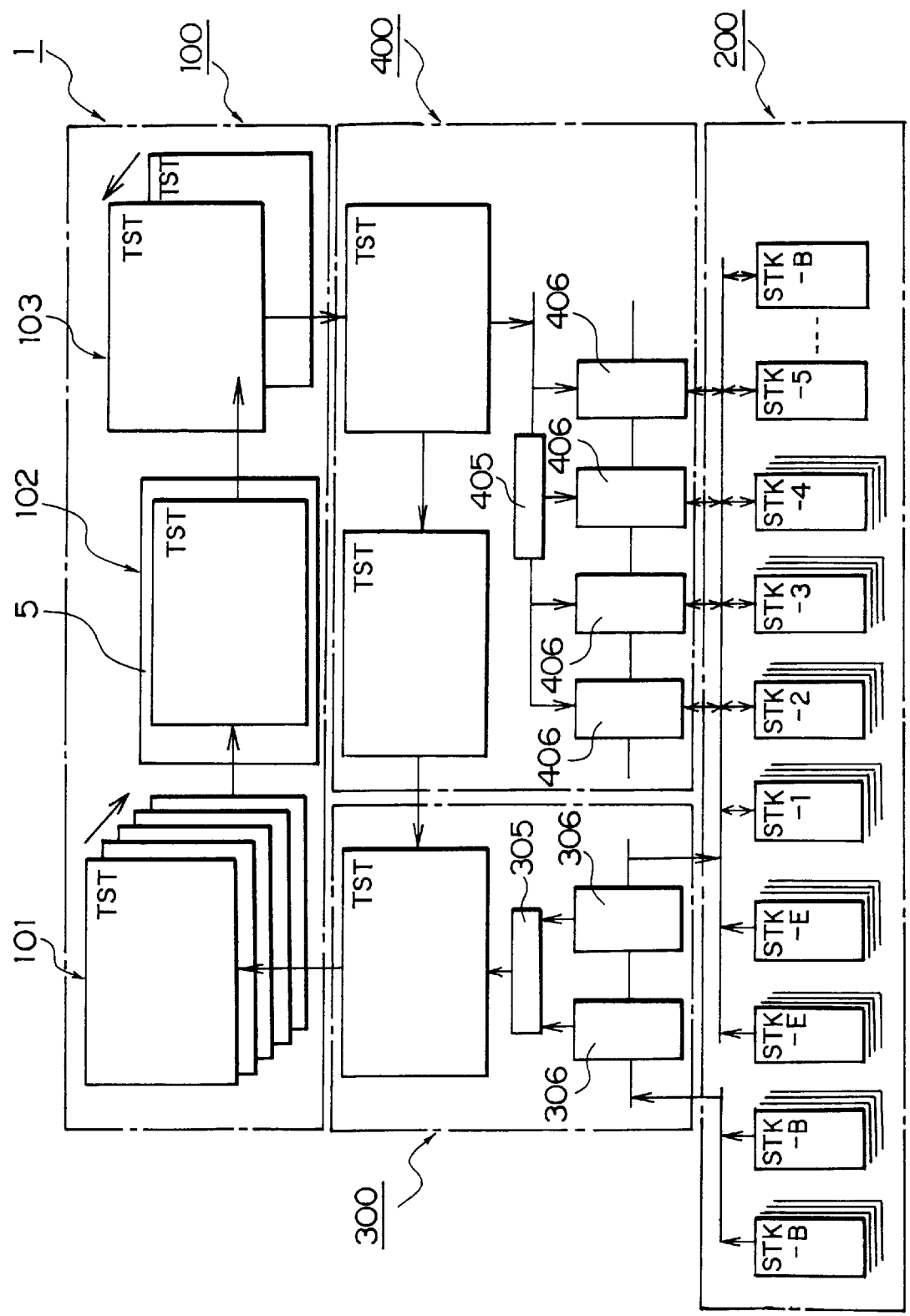
FIG. 7 is a flow chart of a tray showing a handling method of an IC to be tested.

The electric device testing apparatus 10 is an apparatus for testing an IC chip as an electric device to be tested under a normal temperature, a higher temperature condition than the normal temperature (a high temperature) and a lower temperature condition than the normal temperature (a low temperature), and the handler 1 comprises a chamber 100 as shown in FIGS. 6 and 7. The chamber 100 comprises a constant temperature chamber 101 for applying a thermal stress of an aimed high temperature or a lower temperature to the IC chip to be tested, a test chamber 102 for performing a test on an IC chip under the condition of being applied the thermal stress in the constant temperature chamber 101, and a soak chamber 103 for removing the:,thermal stress from the IC chip tested in the test chamber 102. The upper portion of the test head 5 shown in. FIG. 5 is inserted to inside the test chamber 102 as shown in FIG. 1 where an IC chip 2 is to be tested.

Note that FIG. 7 is a view for understanding a handling method of the IC chip to be tested in the electric device testing apparatus of the present embodiment and partially shows by a plane view members actually arranged aligned in the vertical direction. Therefore, the mechanical (three-dimensional) structure can be understood with reference to FIG. 6.

As shown in FIGS. 6 and 7, the handler 1 of the electric device testing apparatus 10 of the present embodiment is comprised of an IC magazine 200 which holds the IC chips to be tested or classifies and stores the tested IC chips, a loader section 300 which sends the IC chips from the IC magazine 200 into a chamber section 100, a chamber section 100 including a test head, and an unloader section 400 for classifying and taking out the tested IC chips which had been tested in the chamber section 100. The IC chips are carried being held on a tray inside the handler 1.

Figure 9:
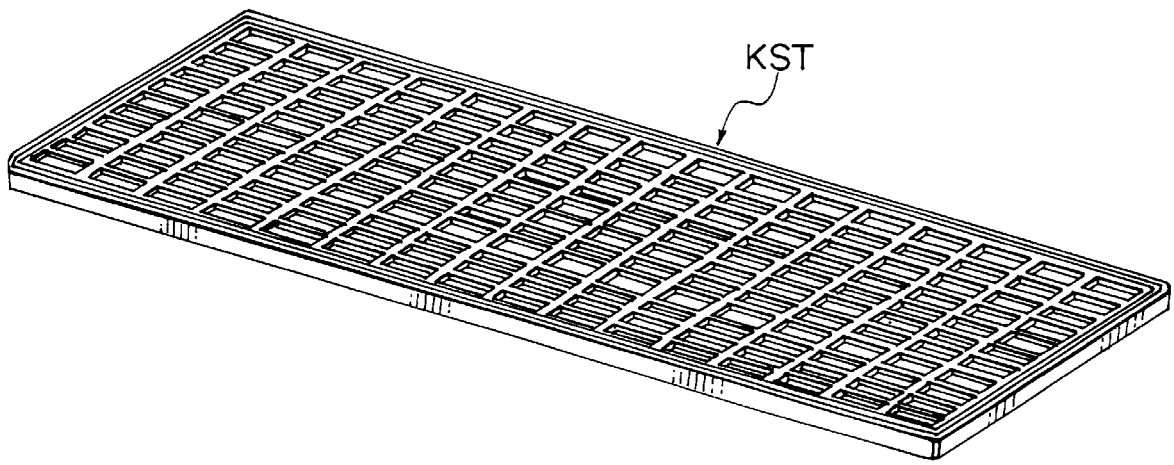
FIG. 9 is a perspective view of a customer tray used in the same electric device testing apparatus.

The IC chips before being held on the handler 1 are stocked in a large amount in a customer tray KST shown in FIG. 9 and supplied as they are to the IC magazine 200 in the handler 1 shown in FIGS. 6 and 7, where the IC chip 2 is reloaded from the customer tray KST to a test tray TST (see FIG. 10) carried inside the handler 1. Inside the handler 1, as shown in FIG. 7, the IC chip is moved while being held on the test tray TST, applied thermal stress of a high temperature or a low temperature to be tested (inspected) whether it properly operates, and sorted in accordance with the test results.

Inside the handler 1 will be explained respectively in detail below.

IC Magazine 200

As shown in FIG. 6, the IC magazine 200 is provided with a pre-test IC stocker 201 for holding IC chips to be tested and a tested IC stocker 202 for holding IC chips classified in accordance with the test results.

Figure 8:
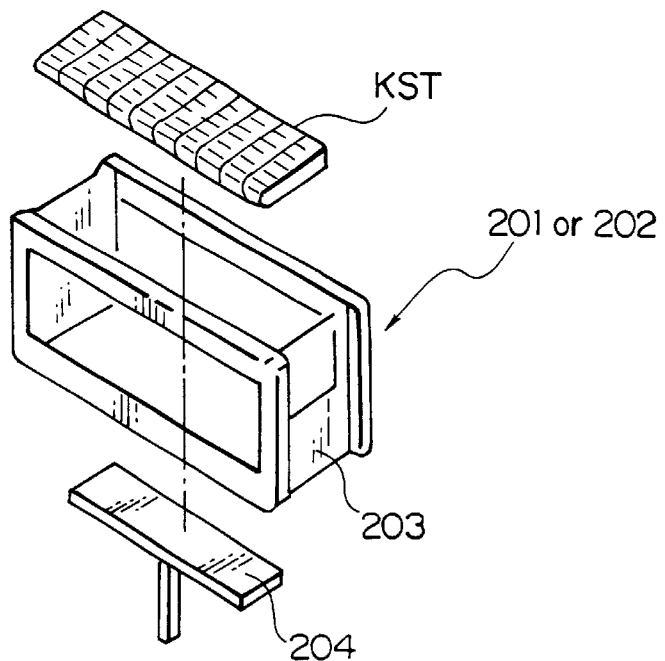
FIG. 8 is a perspective view of an IC stocker of the same electric device testing apparatus.

These pre-test IC stocker 201 and post-test IC stocker 202, as shown in FIG. 8, are each comprised of a frame-shaped tray support frame 203 and an elevator 204 able to enter from under the tray support frame 203 and move toward the top. The tray support frame 203 supports in it a plurality of stacked customer trays KST. Only the stacked customer trays KST are moved up and down by the elevator 204.

The pre-test IC stocker 201 shown in FIG. 6 holds stacked customer trays KST on which the IC chips to be tested are held, while the post-test IC stocker 202 holds stacked customer trays KST on which IC chips finished being tested are suitably classified.

Note that since the pre-test IC stocker 201 and the post-test IC stocker 202 are structured almost the same, the numbers of the pre-test IC stocker 201 and that of the post-test IC stocker 202 may be suitably set in accordance with need.

In the embodiment shown in FIG. 6 and FIG. 7, two stockers STK-B are provided as the pre-test stocker 201.

Two empty stockers STK-E to be sent to the unloader section 400 are provided next to that and eight stockers STK-1, STK-2, . . . , STK-8 are provided further next to that as the post-test IC stocker 202 so that they can hold IC chips sorted into a maximum of eight classes according to the test results. That is, in addition to classifying ICs as good and defective, it is possible to divide the good ICs into ones with high operating speeds, ones with medium speeds, and ones with low speeds and the defective ICs into ones requiring retesting etc.

Loader Section 300

The customer tray KST housed in the frame-shaped tray support frame 203 of the pre-test IC stocker 201 shown in FIG. 8 is conveyed from the lower side of the test board 105 to an opening 306 of the loader section 300 by a tray transfer arm 205 provided between the IC magazine 200 and test board 105 as shown in FIG. 6. Further, in the loader section 300, the IC chips to be tested loaded on the customer tray KST are transferred once to a preciser 305 by the X-Y-conveyor 304. There, the mutual positions of the IC chips to be tested are corrected, then the IC chips to be tested transferred to the preciser 305 are reloaded on the test tray TST stopped at the loader section 300 using the X-Y conveyor 304 again.

The X-Y conveyor 304 reloading the DUTs from the customer tray KST to the test tray TST, as shown in FIG. 6, is provided with two rails 301 laid over the top of the test board 105, a movable arm 302 able to move back and forth (this direction designated as the Y-direction) between the test tray TST and a customer tray KST by these two rails 301, and a movable head 303 supported by the movable arm 302 and able to move in the X-direction along the movable arm 302.

The movable head 303 of the X-Y conveyor 304 has suction heads attached facing downward. The suction heads move while drawing out air to pick up the IC chips to be tested from the customer tray KST and reload the IC chips to be tested on the test tray TST. For example, about eight suction heads are provided for the movable head 303, so it is possible to reload eight IC chips to be tested at one time on the test tray TST.

Note that in a general customer tray KST, indentations for holding the IC chips to be tested are formed relatively larger than the shapes of the IC chips to be tested, so the positions of the IC chips to be tested in a state held on the customer tray KST can vary largely. Therefore, if the IC chips to be tested are picked up by the suction heads and conveyed directly to the test tray TST in this state, it becomes difficult for the IC chips to be dropped accurately into the IC chip receiving indentations formed in the test tray TST. Therefore, in the handler 10 of the present embodiment, an IC chip position correcting means called a preciser 305 is provided between the set position of the customer tray KST and the test tray TST. This preciser 305 has relatively deep indentations surrounded with inclined surfaces at their circumferential edges, so when IC chips to be tested picked up by the suction heads are dropped into these indentations, the drop positions of the IC chips to be tested are corrected by the inclined surfaces. Due to this, the positions of the eight IC chips to be tested with respect to each other are accurately set and it is possible to pick up the correctly positioned IC chips to be tested by the suction heads once again and reload them on the test tray TST and thereby reload the IC chips to be tested precisely in the IC chip receiving indentations formed in the test tray TST.

Chamber 100

The above-mentioned test tray TST is conveyed into the chamber 100 after being loaded with the IC chips to be tested by the loader section 300, then the IC chips to be tested are tested in a state carried on the test tray TST.

The chamber 100 is comprised of a constant temperature chamber 101 for giving a desired high temperature or low temperature thermal stress, or no thermal stress to the IC chips to be tested loaded on the test tray TST, a test chamber 102 for making the IC chips to be tested contact the test head in a state given the thermal stress or no thermal stress by the constant temperature chamber 101, and a soak chamber 103 for removing the given thermal stress from the IC chips to be tested in the test chamber 102.

In the soak chamber 103, when a high temperature was applied in the constant temperature chamber 101, the IC chips to be tested are cooled by blowing in air to return them to room temperature. Alternatively, when a low temperature has been applied in the constant temperature chamber 101, it heats the IC chips to be tested by hot air or a heater etc. to return them to a temperature where no condensation occurs. Next, the thus treated IC chips to be tested are conveyed out to the unloader section 400.

As shown in FIG. 6, the constant temperature chamber 101 and soak chamber 103 of the chamber 100 are arranged so as to project upward from the test chamber 102. Further, the constant temperature chamber 101 is provided with a vertical conveyor as shown schematically in FIG. 7. A plurality of test trays TST stand by supported by the vertical conveyor until the test chamber 102 becomes empty. While standing by, a high temperature or low temperature thermal stress is applied to the IC chips to be tested.

Figure 10:
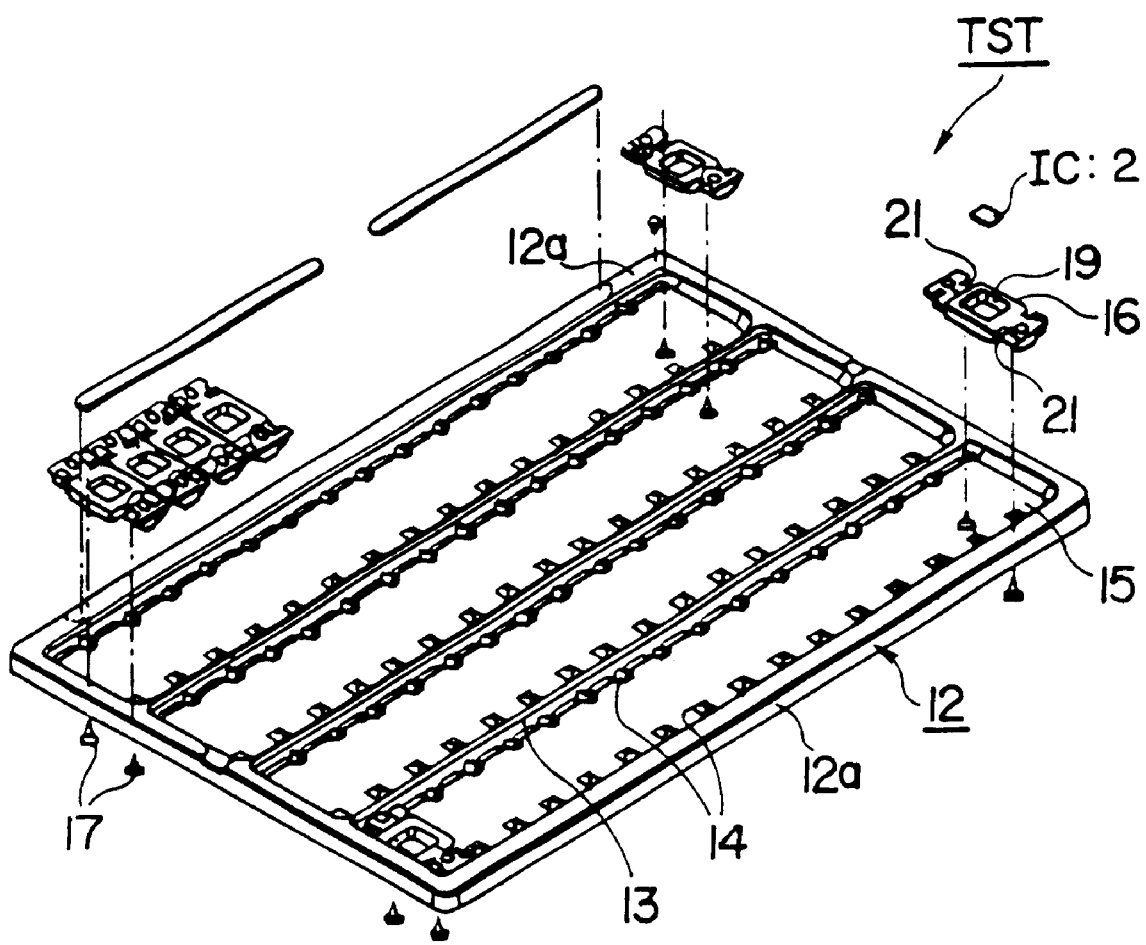
FIG. 10 is a partially disassembled perspective view of a customer tray used in the same electric device testing apparatus.

The test chamber 102 has, as shown in FIG. 7, a test head 5 arranged at its center, where all IC chips 2 held by the test tray TST shown in FIG. 10 are simultaneously or successively brought to be electrically in contact with the test head 5 and all of the IC chips 2 to be tested in the test tray TST are tested. On the other hand, the test tray TST finished being tested is treated in the soak chamber 103 to return the temperature of the IC chips 2 to a room temperature, then is discharged to the unloader section 400 shown in FIG. 6 and FIG. 7.

In front of the constant temperature chamber 101 and the top of the soak chamber 103 is provided a test board 105, as shown in FIG. 6, from which an inlet opening for letting in a test tray TST and an outlet opening for letting out the test tray TST to the test board 105 are formed. This test board 105 has a test tray conveyor 108 mounted on it for conveying the test tray TST into and from the openings. The tray conveyors are configured by, for example, a rotation roller. The test tray TST discharged from the soak chamber 103 by the test tray conveyor 108 provided on the test board 105 is returned to the constant temperature chamber 101 through the unloader section 400 and the loader section 300.

FIG. 10 is a disassembled perspective view of the structure of a test tray TST used in the present embodiment. The test tray TST is comprised of a rectangular frame 12 provided with a plurality of crosspieces 13 in parallel at equal intervals. A plurality of mounting pieces 14 formed projecting out at equal intervals at the two sides of these crosspieces 13 and the sides 12a of the frame 12 facing the crosspieces 13 are also provided. Each of insert holders 15 are comprised between these crosspieces 13, between the crosspieces 13 and the sides 12a, and the two facing mounting pieces 14.

The respective insert holders 15 are designed to receive one insert 16 each. An insert 16 is attached to the two mounting pieces 14 in a floating state using fasteners 17. For this purpose, mounting holes 21 to the mounting pieces 14 are formed at the two ends of the inserts 16. For example, about 16×4 of these inserts 16 are provided in one test tray TST.

Note that the inserts 16 are made the same shape and same dimensions and that the IC chips to be tested 2 are received in the inserts. The IC holder 19 of the insert 16 is determined by the shape of the IC chips to be tested 2 to be received and in the example shown in FIG. 10 is made a rectangular indentation.

Here, if the IC chips to be tested 2 once connected to the test head 5 are arranged in four rows and 16 columns as shown in FIG. 10, then for example four columns of IC chips to be tested 2 arranged in every four rows are simultaneously tested. That is, in the first test, the 16 IC chips to be tested 2 arranged every fourth column from the first column are respectively tested connected to the contact pins 51 of the socket 50 of the test head 104. In the second test, the test tray TST is moved one column and the IC chips to be tested arranged every fourth column from the second column are similarly tested. By doing this a total of four times, all of the IC chips to be tested 2 are tested. The results of the test are stored in the control apparatus of the handler 1 at addresses determined by for example the identification number assigned to the test tray TST and the numbers of the IC chips to be tested 2 assigned inside the test tray TST.

Figure 2:
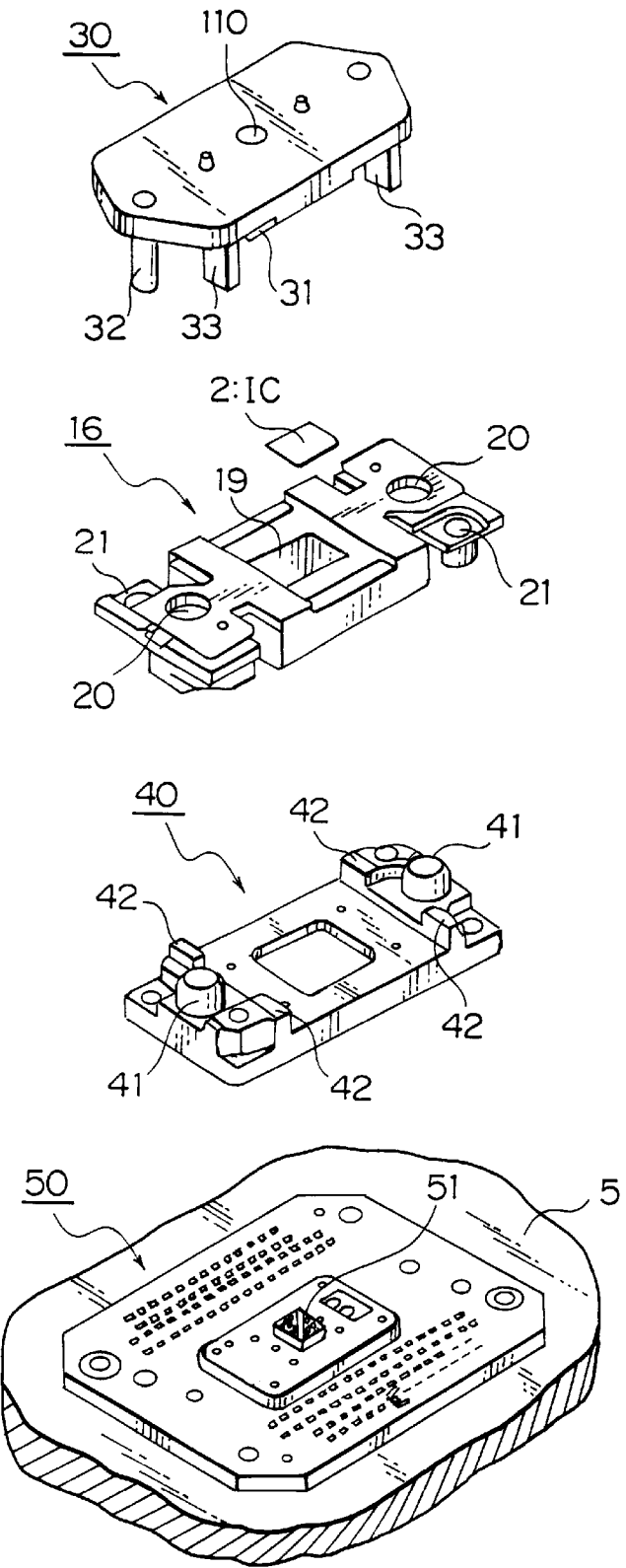
FIG. 2 is a disassembled perspective view of an example of the configuration around a socket in a test head of the same electric device testing apparatus.

On the test head 5, as shown in FIG. 2, the socket 50 are arranged for the number corresponding to 4 columns of IC chips to be tested 2 arranged in every four rows (4×4) on the test tray TST shown in FIG. 9. Note that if a size of the respective socket can be made smaller, four rows and 16 columns of the sockets 50 may be arranged on the test head 5 so that all the IC chips 2 held on the test tray TST shown in FIG. 10 can be simultaneously tested.

As shown in FIG. 2, on the test head 5 being arranged the sockets 50, one socket guide 40 is mounted for every socket 50. The socket guide 40 is fixed to the socket 50.

On the test head 5, the test tray TST shown in FIG. 10 is conveyed and inserts 16 for the number corresponding to the intervals of the IC chips 2 simultaneously tested (four columns for every four columns totaling 16 in the above test tray TST) are made to position on the corresponding socket guides 40.

A pusher 30 shown in FIG. 2 is provided above the test head 5 for the number corresponding to the number of socket guides 40. As shown in FIG. 1, each of the pushers 30 is fixed at the lower end of an adapter 62. Each of the adapters 62 is elastically held by a match plate 60. The match plate 60 is mounted so that it positions above the test head 5 and that the test plate TST can be inserted between the pusher 30 and the socket guide 40. The match plate 60 is mounted movably with respect to a drive plate 72 of the test head 5 or to a Z-axial drive 70, and has the structure of being able to be changed together with the adapter 62 and the pusher 30 in accordance with a shape, etc. of the IC chips to be tested 2. Note that the test plate TST is conveyed from the vertical direction (X-axis) with respect to the paper surface in FIG. 1 to between the pusher 30 and the socket guide 40. As a test plate TST conveying means inside the chamber 100, a convey roller, etc. is used. At the time of conveying and moving the test tray TST, the drive plate of the Z-axial drive 70 rises along the Z-axis and a sufficient space for the test tray TST to be inserted is provided between the pusher 30 and the socket guide 40.

As shown in FIG. 1, on the lower surface of the drive plate 72 provided inside the test chamber 102 is fixed push portions 74 for the number corresponding to the number of the adapters 62, so that the upper surface of the adapters 62 held by the match plate 60 is able to be removably pushed. A drive axis 78 is fixed to the drive plate 72 and is connected to a not shown common pressure cylinder. The common pressure cylinder is configured by, for example, an air pressure cylinder, which makes the drive axis 78 move up and down along the Z-axis and is able to push the upper surface of the adapter 62. Note that the pushing portion 74 is configured by an individually push pressure cylinder and a push rod, etc., and the separately push pressure cylinder may be driven to lower the push rod to separately push the upper surface of the respective adapters after the drive plate 72 comes close to the match plate 60.

Figure 3:
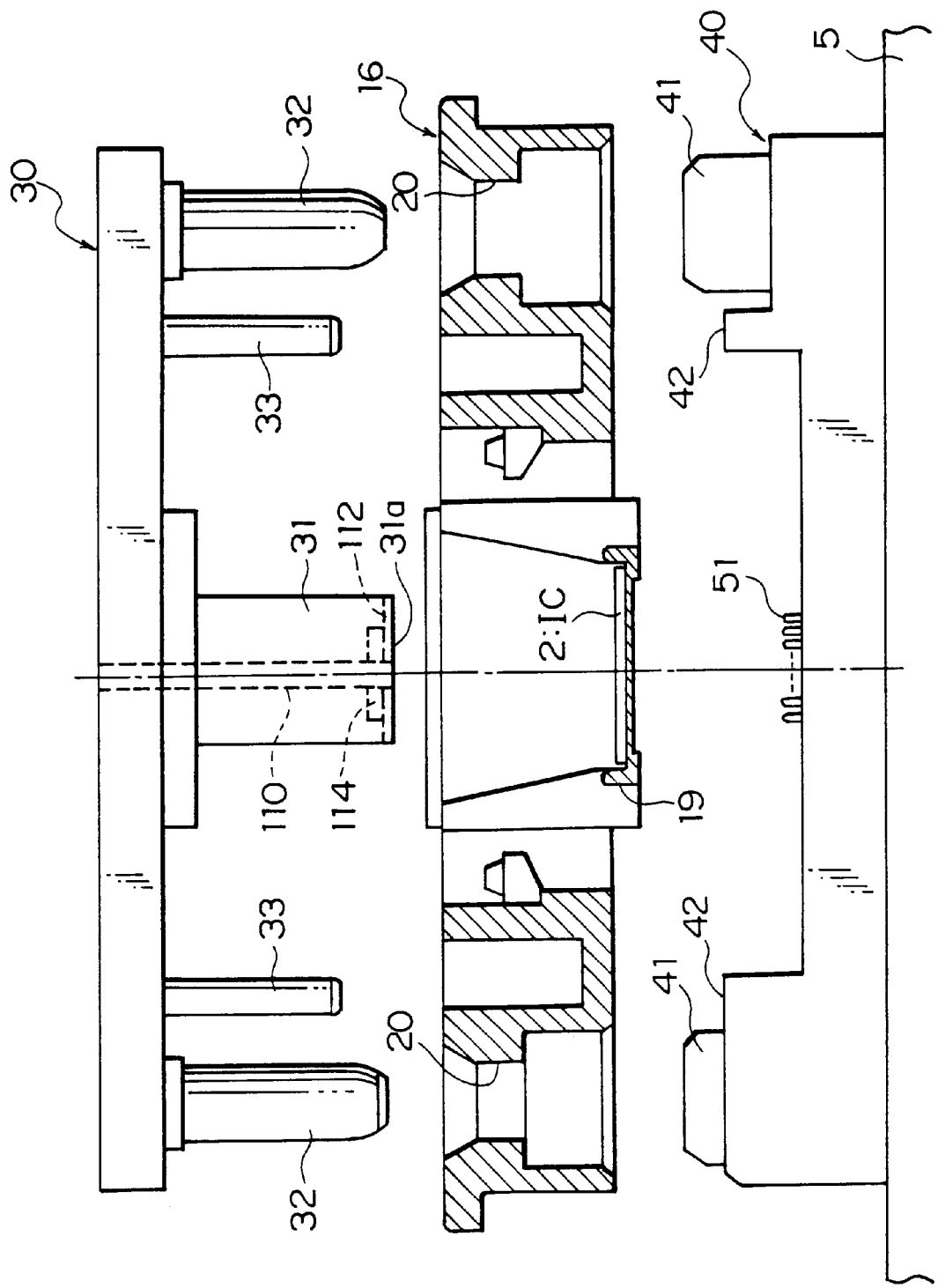
FIGS. 3 and 4 are sectional views around the socket shown in FIG. 2.
Figure 4:
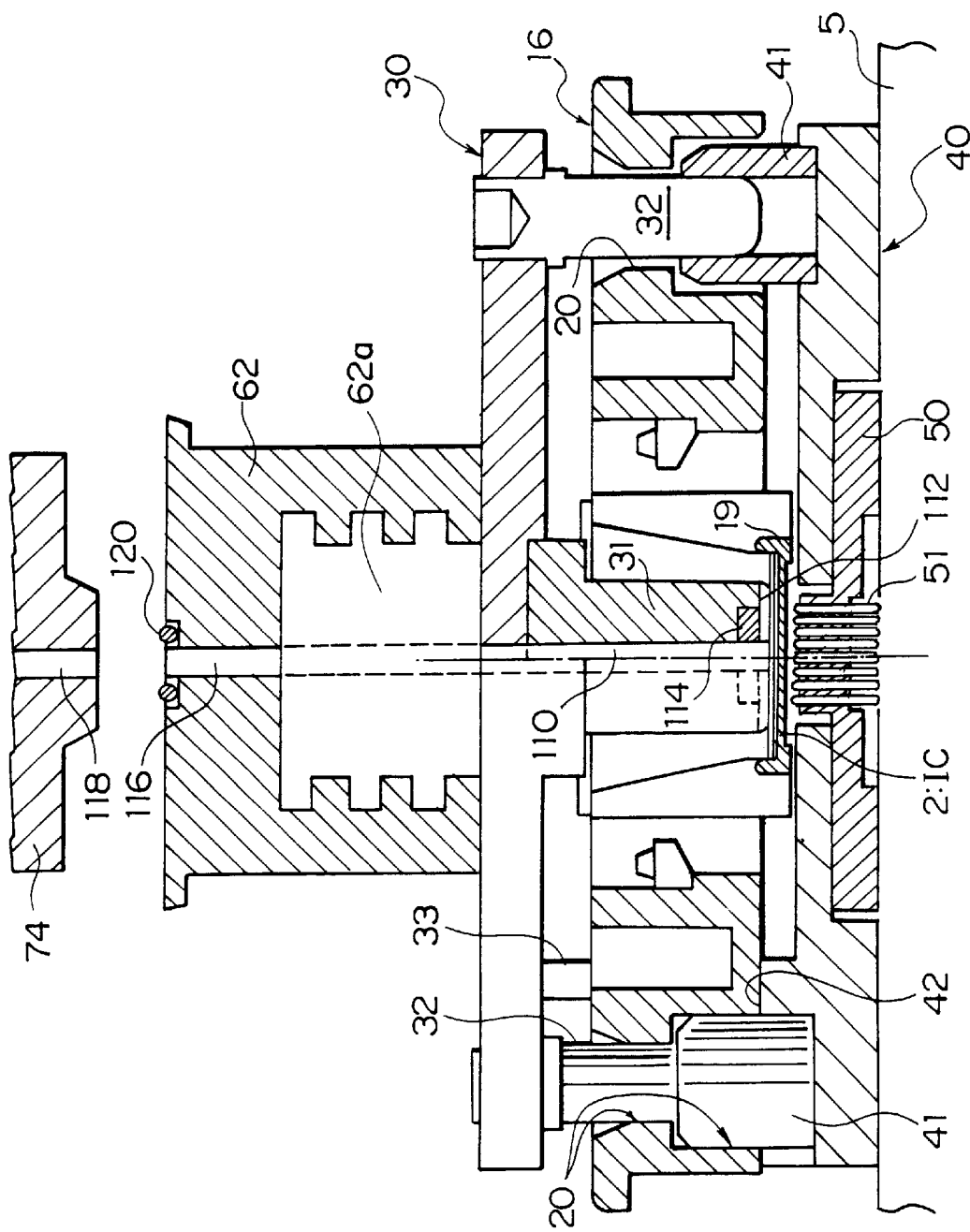

At the center of the pusher 30 fixed to the lower end of each of the adapter 62 is formed a rod 31 for pushing the IC chip to be tested as shown in FIG. 3 and FIG. 4, and both sides of which are provided with a guide pin 32 to be inserted to a guide hole 20 of the insert 16 and a guide push 41 of the socket guide 40. Also, between the rod 31 and the guide pin 32 is provided with a stopper guide 33 for limiting the descent of the pusher 30 by the Z-axial drive 70 (see FIG. 1) as a lower limit. This stopper guide 33 abuts against the stopper surface 42 of the socket guide 40 to determine the lower limit position of the pusher 30, which pushes the IC chip to be tested 2 with a moderate pushing force not to damage.

The respective inserts 16, as shown in FIG. 10, is attached to the test tray TST using a fastener 17. As shown in FIGS. 2 to 4, it is formed at its two sides with guide holes 20 through which the above-mentioned guide pins 32 of the pusher 30 and the guide bushes 41 of the socket guide 40 are inserted.

As shown in FIG. 4 of the state of descent of the pusher 30, the guide hole 20 is for positioning and is made to have a smaller inner diameter than that of the guide hole 20 on the right. Therefore, the guide pin 32 of the pusher 30 is inserted to the upper half of the guide hole on the left for positioning, while the guide bush 41 of the socket guide 40 is inserted to its lower half for positioning. Note that the guide hole 20 on the right side in the Figure fits with play with the guide pin 32 of the pusher 30 and the guide bush 41 of the socket guide 40.

As shown in FIGS. 3 and 4, the insert 16 is formed at its center with an IC holder 19. By dropping an IC chip to be tested 2 here, the IC chip to be tested is loaded on the test tray TST shown in FIG. 10.

As shown in FIGS. 3 and 4, the socket guide 40 fixed to the test head 5 is inserted at its two sides two guide pins 32 formed on the pusher 30, and guide bushes 41 are provided for positioning between positions with these two guide pins 32. The guide bush 41 at the upper left in the figure performs positioning also with the insert 16 as explained above.

As shown in FIG. 4, at the lower side of the socket guide 40 is fixed a socket 50 having a plurality of contact pins 51. These contact pins 51 are biased in the upward direction by not shown springs. Therefore, although a DUT is pushed, the contact pins 51 will retract to the top surface of the socket 50. On the other hand, it is possible for the contact pins 51 to contact all of the terminals of the IC chip 2 even if the IC chips to be tested 2 are pushed somewhat at an angle.

In the present embodiment, as shown in FIG. 1, in the chamber 100 configured as above, inside the sealed casing 80 composing the test chamber 102 is mounted a temperature adjusting ventilator 90. The temperature adjusting ventilator 90 comprises a fan 92 and a heat exchanger 94 and keeps inside casing 80 at a predetermined temperature condition (high or low temperature) by blowing the air inside the casing by the fan 92 and blowing out inside the casing 80 via the heat exchanger 94.

The heat exchanger 94 of the temperature adjusting ventilator 90 comprises a heat releasing heat exchanger wherein heating medium is flown or an electric heater when making inside the casing at a high temperature, and able to provide sufficient heat to maintain inside the casing at a high temperature, for example, from a room temperature to about 160° C. Also, when making inside the casing at a low temperature, the heat exchanger 94 is configured by a heat absorbing heat exchanger wherein coolant, such as liquid nitrogen, circulates, which can absorb sufficient heat to maintain inside the casing at a low temperature of, for example, −60° C. to the room temperature. The temperature inside the casing 80 is detected, for example, by a temperature sensor 82, and an amount of wind blown by the fan 92 and amount of heat of the heat exchanger 94 are controlled to maintain inside the casing 80 at a predetermined temperature.

Note that in the above explanation, it is supposed that inside the test chamber 102 is maintained at a high temperature state of about 80° C. for conducting a high temperature test on IC chips 2.

The warm wind generated through the heat exchanger 94 of the temperature adjusting ventilator 90 flows along Y-axial direction above the casing 80 and falls along the side wall of the casing which is an opposite side of the apparatus 90, and returns to the apparatus 90 through the space between the match plate 60 and the test head 5 to circulate inside the casing.

In the present embodiment, in an electric device testing apparatus 10 having a test chamber 102 provided with the temperature adjusting ventilator 90, as shown in FIGS. 3 and 4, a first ventilation hole 110 is formed along the center of the axis on the rod 31 of the respective pusher 30. The lower-end opening of the first ventilation hole 110 is formed at the approximate center of the lower-end surface of the rod 31. On the lower-end surface 31a of the rod 31 is formed a plurality of radius grooves 112 extending in the radius direction. These radius grooves 112 are connected to the first ventilation hole 110. The radius grooves 112 are ventilation path grooves to prevent the lower-end opening of the first ventilation hole 110 from completely sealed even when the lower-end surface 31a of the rod 31 contacts the IC chip 2.

Inside the rod 31 and near the crossing point of the first ventilation hole and the radius groove 112 is mounted a temperature sensor 114. The temperature sensor 114 is configured by a contact-type temperature sensor like a thermocouple or a non-contact-type temperature sensor like a radiation thermometer and designed to detect the temperature of the IC chip 2 itself or the atmosphere temperature around the IC chip. The temperature data detected from the temperature sensor 114 is sent to the control apparatus and later explained operations of an air distributer 121, a temperature control means 124, a ventilation amount control means 126, etc. are controlled based on the temperature data.

As shown in detail in FIG. 4, the upper-end opening of the first ventilation hole 110 is opened facing the upper surface of the pusher 30. The upper-end opening of the first ventilation hole 1 is connected to inside a second ventilation hole 116 via an inner space portion 62a formed inside the adapter 62. The substantially sealed inner space portion 62a is formed when the upper surface of the pusher 30 is fitted to the lower surface of the adapter 62, however, it is not always necessarily to be completely sealed. Note that in a case of an adapter 62 without the inner space portion 62a, the second ventilation hole 116 extends in the axial direction, and the second ventilation hole 116 and the first ventilation hole 110 are directly connected when fitting the upper surface of the pusher 30 with the lower surface of the adaptor 62.

An O-ring groove is formed on the upper surface of the adapter 62 positioned around the upper-end opening of the second ventilation hole 116 formed on the adaptor 62, and the O-ring groove is fitted an O-ring 120 as a sealing member. When the lower surface of the pushing portion 74 contacts the upper surface of the adaptor 62, the O-ring 120 is elastically deformed between them to make the upper-end opening of the second ventilation hole 116 be tightly connected to the lower-end opening of a third ventilation hole formed on the pushing portion 74. Note that in FIG. 4, for an easier illustration, the lower surface of the pushing portion 74 is away from the upper surface of the adapter 62, however, the lower surface of the pushing portion 74, actually contacts and pushes the upper surface of the adaptor 62 in a testing state wherein the rod 31 of the pusher 30 pushes the IC chip 2 in the direction of a connection terminal 51 of the socket. Of course the third ventilation hole 118 and the second ventilation hole 116 are connected in that state.

As shown in FIG. 1, the third ventilation hole 118 formed on the respective pushing portion 74 is connected to the air distributer 121 via a ventilation tube. The air distributer 121 is an apparatus for distributing a temperature adjusted air (temperature adjusted gas) supplied from the temperature control means 124 arranged outside the test chamber via the ventilation tube to the first ventilation hole 110 on the respective pushers 30. The air distributer 121 may comprises, for example, a flowing amount control valve for separately controlling the ventilation amount to ventilate the temperature adjusted air to the respective IC chips 2 via the respective ventilation holes 110. Also, the air distributer 121 may be provided therein with a cooling element or a heater, and the temperature of the temperature adjusted air blown to the IC chips 2 from the first ventilation hole 110 of the respective pushers 30 can be adjusted individually for every IC chip 2.

The air distributer 121 is mounted on the upper surface of the drive plate 72 in the present embodiment. Each of the air distributers 121 is connected to the temperature control means 124 arranged outside the casing 80 of the test chamber 102 via the ventilation tube 122. Note that the air distributer 121 may also be arranged outside the casing 80 according to circumstances. Oppositely, the temperature control means 124 may be arranged inside the casing 80. Note that since inside the casing 80 is maintained at a high temperature, at least the temperature control means 124 is preferably arranged outside the casing 80.

The temperature control means 124 is connected to an overall ventilation amount control means 126, a dry means 128 and an air supply means 130 in the order. In the present embodiment, the temperature control means 124, the overall ventilation amount control means 126, the dry means 128 and the air supply means 130 compose a temperature adjusted gas supply means of the present invention. Note that the temperature adjusted gas supply means of the present invention may include the air distributer 121 and other members, as well.

The air supply means 130 comprises a ventilation apparatus, such as a fan and a compressor, and ventilate an air outside the test chamber 102 to the dry means 128. The dry means 128 is a typical apparatus and for generating a dry air for drying the air supplied from the air supply means 130. The overall ventilation control means 126 is an apparatus for controlling the overall ventilation amount blown from the first ventilation hole 110 on the pusher 30 positioned inside the test chamber 102, and composed of an electrically controlled flowing amount control valve, etc. The temperature control means 124 is an apparatus for controlling the temperature of the temperature adjusted air as a whole blown to the IC chip 2 from the first ventilation hole 110 of the pusher 30.

The temperature adjusted air treated in the above way is blown around the IC chip 2 via the ventilation tube 122, the air distributer 121, the ventilation holes 118, 116 and 110, and radius grooves 112.

Unloader Section 400

The unloader section 400 shown in FIGS. 6 and 7 is provided with two X-Y conveyors 404, 404 of the same structure as the X-Y conveyor 304 provided at the loader section 300. The X-Y conveyors 404, 404 reload the post-test IC chips from the test tray TST carried out to the unloader section 400 to the customer tray KST.

As shown in FIG. 6, the test board 105 of the unloader section 400 is provided with two pairs of openings 406, 406 arranged so that the customer trays KST carried to the unloader section 400 can be brought close to the top surface of the test board 105.

Further, while not illustrated, an elevator table for elevating or lowering a customer tray KST is provided below the openings 406. A customer tray KST becoming full after being reloaded with the tested DUTs is placed on here and lowered and the full tray is passed to the tray transfer arm 205.

Note that in the handler 1 of the present embodiment, while there are a maximum of eight types of sortable categories, it is only possible to arrange a maximum of four customer trays KST at the openings 406 of the unloader section 400. Therefore, there is a limit of four sortable categories in real time. In general, four categories are sufficient, i.e., good ICs can be classified into high speed response devices, medium speed response devices, and low speed response devices plus defective devices, but there may also arise categories not belonging to these categories such as devices requiring retesting.

In this way, when DUTs arise which are classified into a different category than the categories given to four customer trays arranged at the openings 406 of the unloader section 400 (see FIGS. 8 and 9), one customer tray KST may be returned from the unloader section 400 to the IC magazine 200 and a customer tray KST to hold DUTs of the newly arising category may be transferred to the unloader section 400 in its place so as to hold these DUTs. If customer trays KST are switched in the middle of sorting work, the sorting work has to be interrupted during that time and therefore there is the problem of a reduction in the throughput. Therefore, in the handler 1 of the present embodiment, a buffer section 405 is provided between the test tray TST and the opening 406 of the unloader section 400, and DUTs of a category rarely appearing are stored temporarily at this buffer section 405.

For example, the buffer section 405 is given a capacity able to hold 20 to 30 or so DUTs. A memory is provided for storing the category of ICs held at the IC chip holding locations of the buffer section 405. The categories and positions of the DUTs temporarily stored at the buffer section 405 are stored for each DUT. In the intervals of the sorting work or when the buffer section 405 has become full, customer trays KST of the categories to which the DUTs stored at the buffer section 405 belong are called up from the IC magazine 200 and the ICs received on these customer trays KST. At this time, sometimes the DUTs temporarily stored at the buffer section 405 span several categories, but at this time it is sufficient to call up several customer trays KST at one time from the openings 406 of the unloader section 400 when calling up customer trays KST.

Operation of Testing Apparatus 10

As shown in FIG. 1, when carrying out a high temperature test on the IC chip 2 inside the test chamber 102, the IC chip 2 becomes high temperature due to its self-heating and the temperature around the IC chip 2 becomes higher than the set temperature in a usual case.

On the other hand, an electric device testing apparatus of the present embodiment 10, an air taken in by the air supply means 130 is temperature adjusted by supplying the air to the dry means 128, the ventilation amount control means 126 and the temperature control means 124. The temperature adjusted air in this way is a dry air and set, for example, at a temperature specified in the test specification, or at a temperature to make the temperature on the IC chip 2 detected by the temperature sensor 114 (see FIGS. 3 and 4) close to the set temperature. For example, when the test specification specifies a high temperature test of 80° C., the temperature of the air is adjusted at 80° C. or less in order to maintain the IC chip 2 under the test at 80° C.

The temperature adjusted air in the above way is directly blown around the respective IC chips 2 via the ventilation tube 122, the air distributer 121, the ventilation holes 118, 116 and 110, and the radius grooves 112 in the present embodiment. Note that during the test, by detecting the temperature on the respective IC chips 2 by the temperature sensor 114, the temperature and/or amount of the temperature adjusted gas blown to the IC chips 2 may be adjusted exactly by the air distributer 121 so that the IC chips 2 becomes at the temperature specified in the test specification. It is because even if the IC chips 2 to be tested are all identical, as shown in FIG. 1, an air flow exists inside the test chamber 102 due to the temperature adjusted ventilation apparatus 90, and the temperature on the IC chips 2 during the test may vary depending on the position of the IC chip 2 inside the chamber.

As explained above, in the electric device testing apparatus 10 according to the present embodiment, the IC chip 2 is always tested in a state of being close to a set temperature (temperature specified in the test specification) and the reliability of the test improves.

Also, in the present embodiment, by detecting the temperature of the IC chip 2 and/or the atmosphere temperature around the IC chip 2 by the temperature sensor 114, and by controlling the temperature of the temperature adjusted air and/or the ventilation amount based on the temperature data from the temperature sensor 114, the temperature can be controlled to be stable and uniform, unnecessary ventilation can be eliminated and it also contributes to save energy.

Note that the present invention is not limited to the above explained embodiments and a variety of modifications can be made within the scope of the present invention.

For example, in the testing apparatus 10 according to the above embodiment, the air supply means 130 adjusts the temperature of an air outside the test chamber 102 by supplying it to the dry means 128, the ventilation amount control means 126 and the temperature control means 124, and the temperature adjusted air is blown around the IC chip 2 via the ventilation tube 122, the air distributer 121 and ventilation holes 118, 116 and 110. However, in the present invention, the air supply means 130 may supply the air inside the test chamber 102 to the dry means 128, the ventilation amount control means 126 and the temperature control means 124 to be temperature adjusted, and the temperature adjusted air may be blown around the IC chip 2 via the ventilation tube 122, the air distributer 121 and ventilation holes 118, 116 and 110. In this case, since the air inside the test chamber 102 is circulated to be used, the energy required by the temperature adjusting can be reduced so it contributes to save energy.

Also, the temperature adjusted gas supply means used in the electric device testing apparatus according to the present invention is sufficient if comprising at least the temperature control means 124 shown in FIG. 1, and one or more of the ventilation amount control means 126, the dry means 128, the air supply means 130 and the distributer 121, etc. may be omitted or replaced by replaceable apparatuses.

Furthermore, in the present invention, an air is preferable as the gas to be blown to the IC chip from the first ventilation hole 110 on the pusher 30, however, other gases may be used in accordance with circumstances.

Also, in the present invention, as shown in FIGS. 6 and 7, the chamber 100 was comprised by the constant temperature chamber 101, the test chamber 102 and the soak chamber 103, however, the constant temperature chamber 101 and/or the soak chamber 103 can be omitted in the testing apparatus according to the present invention. Furthermore, the specific configuration of the testing apparatus according to the present invention is not limited to the above embedment. Also, the electric device to be tested by the testing apparatus according to the present invention is not limited to IC chip.

Second Embodiment

Figure 11:
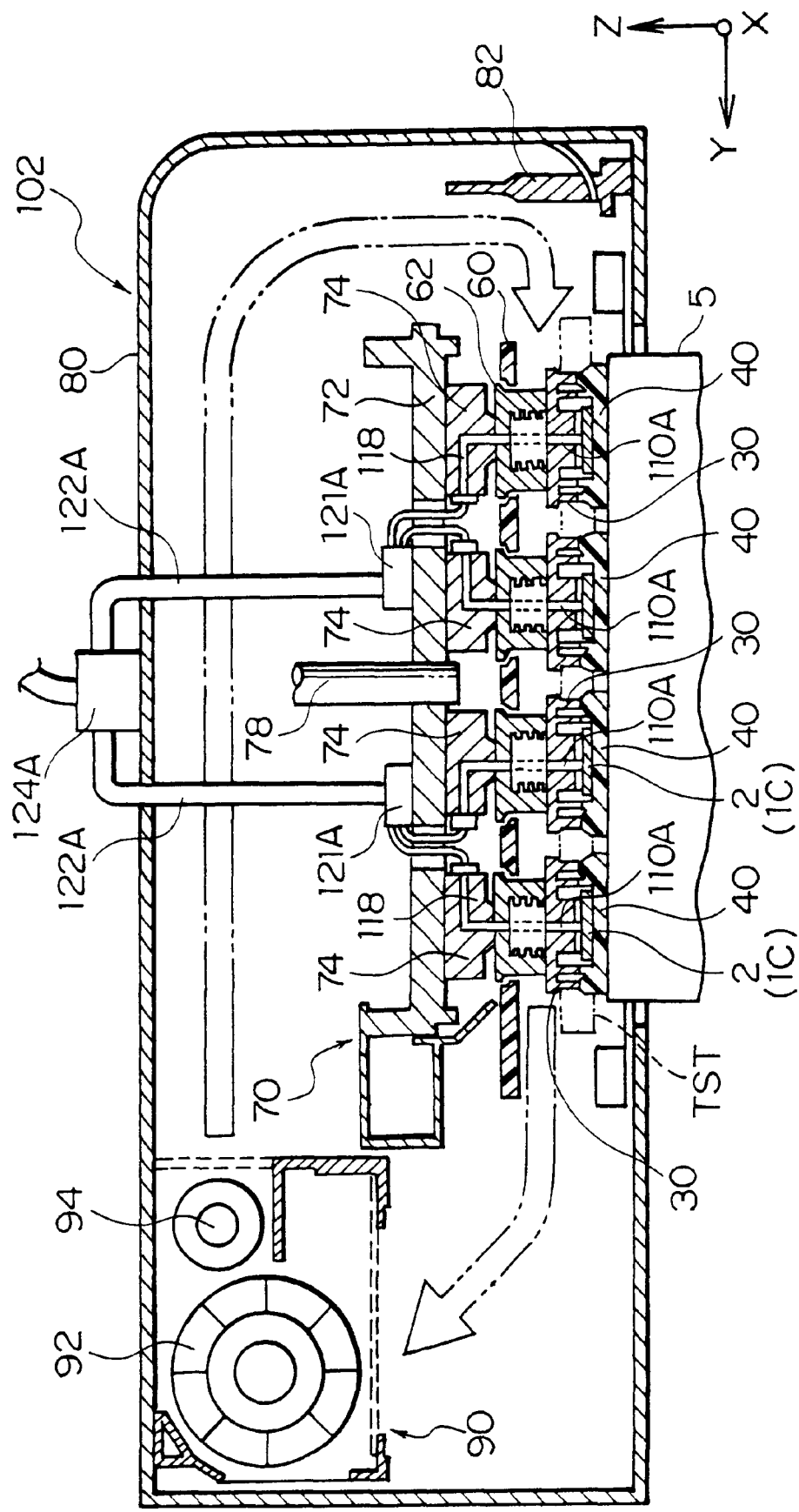
FIG. 11 is a sectional view of a core portion of an electric device testing apparatus according to a second embodiment of present invention.

In the present embodiment, in the chamber 100 configured in the same way as in the above first embodiment, inside the sealed casing 80 composing the test chamber 102 is mounted a temperature adjusting ventilator 90 for adjusting the temperature as shown in FIG. 11. The temperature adjusting ventilator 90 comprises a fan 92 and a heat exchanger 94 and keeps inside casing 80 at a predetermined temperature condition (high or low temperature) by blowing the air inside the casing by the fan 92 and blowing out inside the casing 80 via the heat exchanger 94.

The heat exchanger 94 of the temperature adjusting ventilator 90 comprises a heat releasing heat exchanger wherein heating medium is flown or an electric heater when making inside the casing at a high temperature, and able to provide sufficient heat to maintain inside the casing at a high temperature, for example, from a room temperature to about 160° C. Also, when making inside the casing at a low temperature, the heat exchanger 94 is configured by a heat absorbing heat exchanger wherein coolant, such as liquid nitrogen, circulates, which can absorb sufficient heat to maintain inside the casing at a low temperature of, for example, −60° C. to the room temperature. The temperature inside the casing 80 is detected, for example, by a temperature sensor 82, and an amount of wind blown by the fan 92 and amount of heat of the heat exchanger 94 are controlled to maintain inside the casing 80 at a predetermined temperature.

The warm or cool wind generated through the heat exchanger 94 of the temperature adjusting ventilator 90 flows along Y-axial direction above the casing 80 and falls along the side wall of the casing which is an opposite side of the apparatus 90, and returns to the apparatus 90 through the space between the match plate 60 and the test head 5 to circulate inside the casing.

Figure 12:
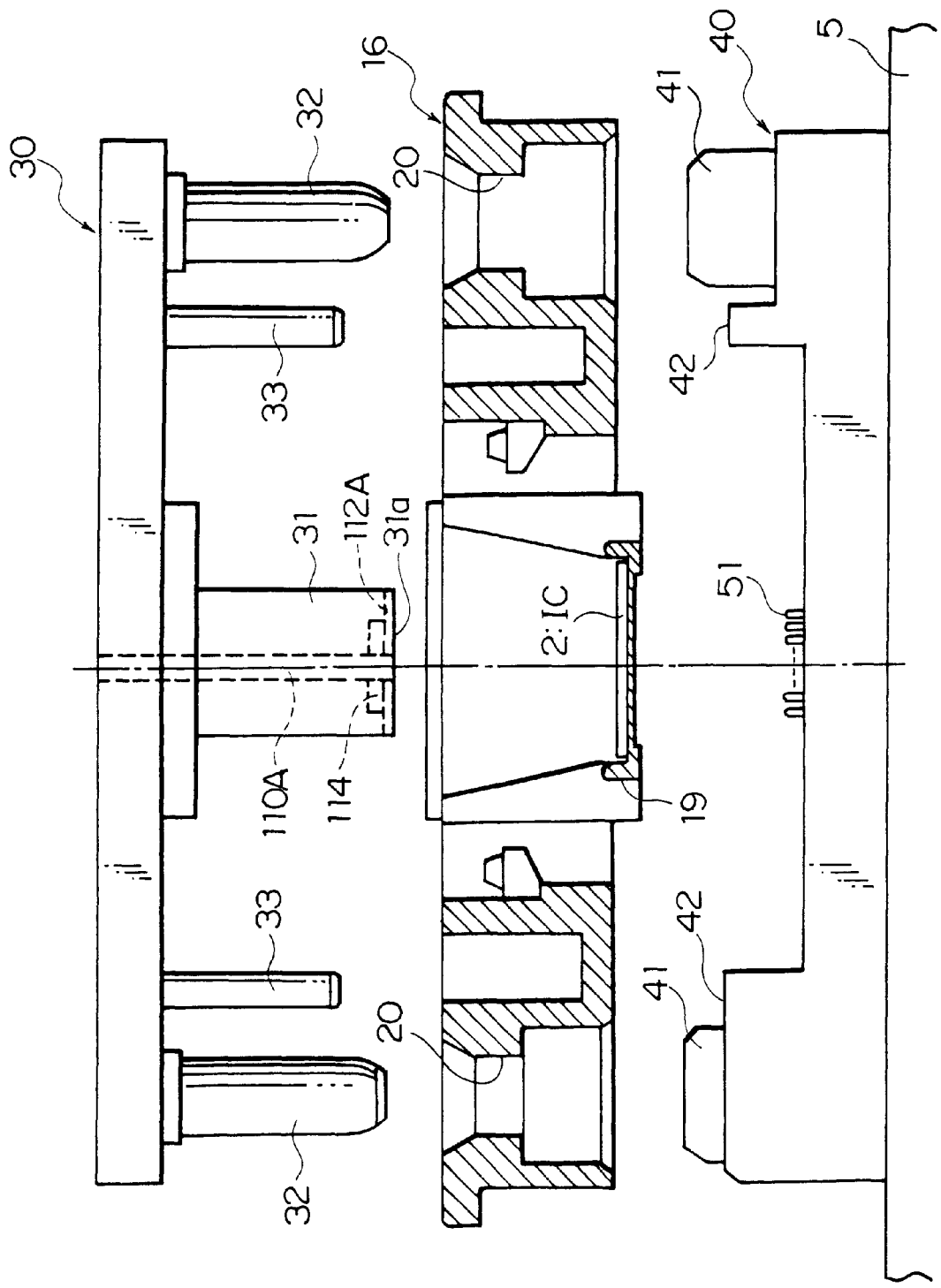
FIG. 12 is a sectional view of around a socket showing a state before pusher pushes an IC chip.
Figure 13:
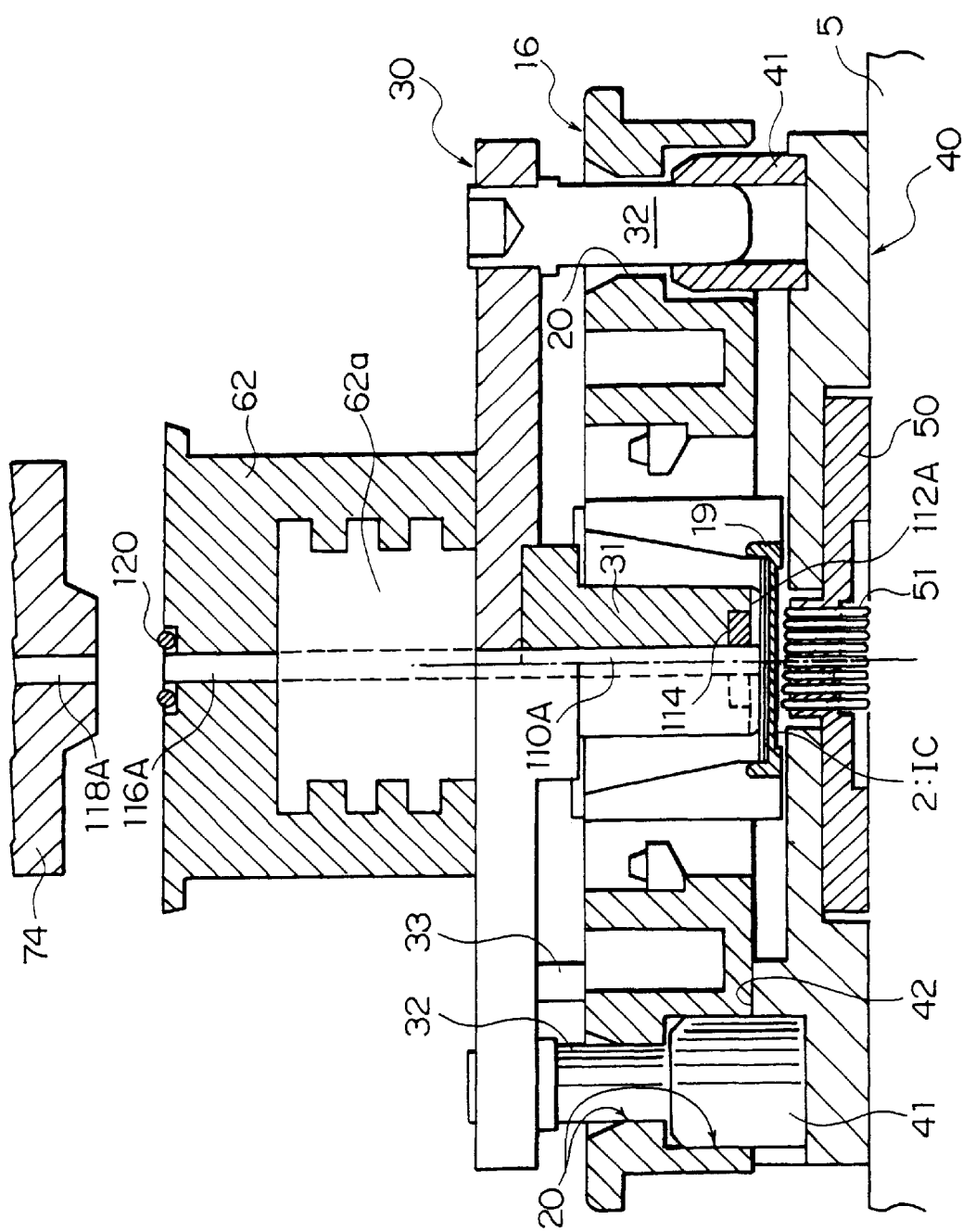
FIG. 13 is a sectional view of around the socket showing a state when the pusher pushes the IC chip.

In the present embodiment, in an electric device testing apparatus 10 having a test chamber 102 provided with the temperature adjusting ventilator 90, as shown in FIGS. 12 and 13, a first ventilation hole 110A is formed along the center of the axis on the rod 31 of the respective pusher 30. The lower-end opening of the first ventilation hole 110A is formed at the approximate center of the lower-end surface of the rod 31. On the lower-end surface 31a of the rod 31 is formed a plurality of radius grooves 112A extending in the radius direction. These radius grooves 112A are connected to the first ventilation hole 110A. The radius grooves 112A are ventilation path grooves to prevent the lower-end opening of the first ventilation hole 110A from completely sealed even when the lower-end surface 31a of the rod 31 contacts the IC chip 2.

Inside the rod 31 and near the crossing point of the first ventilation hole and the radius groove 112A is mounted a temperature sensor 114. The temperature sensor 114 is configured by a contact-type temperature sensor like a thermocouple or a non-contact-type temperature sensor like a radiation thermometer and designed to detect the temperature of the IC chip 2 itself or the atmosphere temperature around the IC chip. The temperature data detected from the temperature sensor 114 is sent to the control apparatus and later explained operations of flow amount controller 121 and/or an ejector 124 are controlled based on the temperature data.

The upper-end opening of the first ventilation hole 110A is opened facing the upper surface of the pusher 30. The upper-end opening of the first ventilation hole 110A is connected to inside a second ventilation hole 116A via an inner space portion 62a formed inside the adapter 62. The substantially sealed inner space portion 62a is formed when the upper surface of the pusher 30 is fitted to the lower surface of the adapter 62, however, it is not always necessarily to be completely sealed. Note that in a case of an adapter 62 without the inner space portion 62a, the second ventilation hole 116A extends in the axial direction, and the second ventilation hole 116 and the first ventilation hole 110A are directly connected when fitting the upper surface of the pusher 30 with the lower surface of the adaptor 62.

As shown in FIG. 4, an O-ring groove is formed on the upper surface of the adapter 62 positioned around the upper-end opening of the second ventilation hole 116A formed on the adaptor 62, and the O-ring groove is fitted an O-ring 120 as a sealing member. When the lower surface of the pushing portion 74 contacts the upper surface of the adaptor 62, the O-ring 120 is elastically deformed between them to make the upper-end opening of the second ventilation hole 116A be tightly connected to the lower-end opening of a third ventilation hole 118A formed on the pushing portion 74. Note that in FIG. 13, for an easier illustration, the lower surface of the pushing portion 74 is away from the upper surface of the adapter 62, however, the lower surface of the pushing portion 74 actually contacts and pushes the upper surface of the adaptor 62 in a testing state wherein the rod 31 of the pusher 30 pushes the IC chip 2 in the direction of a connection terminal 51 of the socket. Of course the third ventilation hole 118A and the second ventilation hole 116A are connected in that state.

As shown in FIG. 11, the third ventilation hole 118A formed on the respective pushing portion 74 is connected to flow amount controller 121A via a ventilation tube. The flow amount controller 121A is composed of, for example, a flowing amount control valve, and controls the drawing amount of the air to be drawn from around the IC chips 2 through ventilation hole 110A, 116A and 118A.

The flow amount controller 121A is mounted on the upper surface of the drive plate 72 in the present embodiment. Each of the flow amount controller 121A is connected to the ejector 124A arranged outside the casing 80 of the test chamber 102 via the ventilation tube 122A. Note that the flow amount controller 121A may also be arranged outside the casing 80 according to circumstances. Oppositely, the ejector 124A may be arranged inside the casing 80. Note that since inside the casing 80 is maintained at a high temperature, at least the ejector 124A is preferably arranged outside the casing 80.

The ejector 124A is an apparatus for generating a negative pressure having a function of drawing an air around the IC chips 2 under being tested and discharging to the outside via the ventilation tube 122A, flow amount controller 121A, third ventilation hole 118A, second ventilation hole 116A, first ventilation hole 110A and radius grooves 112A. Inside the test chamber 102 is kept at a high temperature or at a low temperature and the air to be drawn by the ejector 124A is also at a high temperature or at a low temperature, thus it is preferable that the ejector 124A is a high temperature or low temperature resistant ejector. Or an ejector for a normal temperature can be used by returning the temperature of the air to a normal temperature by a heat exchange, etc. before reaching to the ejector.

Note that other drawing means, such as a vacuum pomp may be also used instead of the ejector 124A.

As shown in FIG. 11, when carrying out a high temperature or low temperature test on the IC chip 2 inside the test chamber 102, the IC chip 2 becomes high temperature due to its self-heating and the temperature around the IC chip 2 becomes higher than the set temperature in a usual case. Especially, in a low temperature test, it is necessary that the temperature inside the chamber 102 is lowered to about −60° C. In this case, if the IC chip 2 is not kept to be a predetermined temperature due to its self-heating, the reliability of the test declines. Also, when an IC chip 2 becomes to be a higher temperature in a high temperature test due to the self-heating, the reliability of the test declines, in addition, there arises a fear that the IC chip itself may be damaged.

In the electric device testing apparatus 10 according to the present embodiment, the atmosphere gas around the IC chip 2 which has become a higher temperature than a set temperature due to the self-heating is drawn to the ejector 124A via the radius groove 112A, first ventilation hole 110A, second ventilation hole 116A, third ventilation hole 118A and flow amount controller 121A. Therefore, the atmosphere gas around the IC chip 2 is always drawn to be discharged and the heat caused by the self-heating during the test on the IC chip 2 is taken away, and an air adjusted to be the set temperature in the chamber 102 is flown around the IC chip 2, instead. As a result, the IC chip 2 is always tested under the condition close to a set temperature and the reliability of the test improves.

Also, in the present embodiment, the temperature on the IC chip 2 and/or the temperature of the atmosphere temperature around the IC chip are detected by the temperature sensor 114, operation of the flow amount controller 121A and/or the ejector 124A are controlled based on the temperature data from the temperature sensor 114, and the drawing amount from around the respective IC chips 2 is separately controlled. Therefore, the temperature control on every IC chip 2 can be made stable, unnecessary drawing (ventilation) can be eliminated, so it contributes to save energy.

Note that the flow amount controller 121A shown in FIG. 11 is not always necessarily provided in the present invention, and the third ventilation hole 118A may be directly connected to the ejector 124A or other ventilation means. Also, in the present invention, the chamber 100 was comprised by the constant temperature chamber 101, the test chamber 102 and the soak chamber 103, however, the constant temperature chamber 101 and/or the soak chamber 103 can be omitted in the testing apparatus according to the present invention. Furthermore, the specific configuration of the testing apparatus according to the present invention is not limited to the above embedment. Also, the electric device to be tested by the testing apparatus according to the present invention is not limited to IC chip.

Third Embodiment

The electric device testing apparatus 1 of the present embodiment tests (inspects) whether the IC is operating suitably in a state applying a normal temperature, a high temperature of, for example, 125° C. or low temperature of, for example, −30° C. thermal stress to the DUTs and classifies the ICs in accordance with the test results. The operating test in the state with thermal stress applied is performed by reloading the DUTs from a tray carrying a large number of DUTs to be tested (hereinafter also called the "customer tray KT", not shown) to an IC carrier CR (see FIG. 18) conveyed through the inside of the IC testing apparatus 1.

Figure 14:
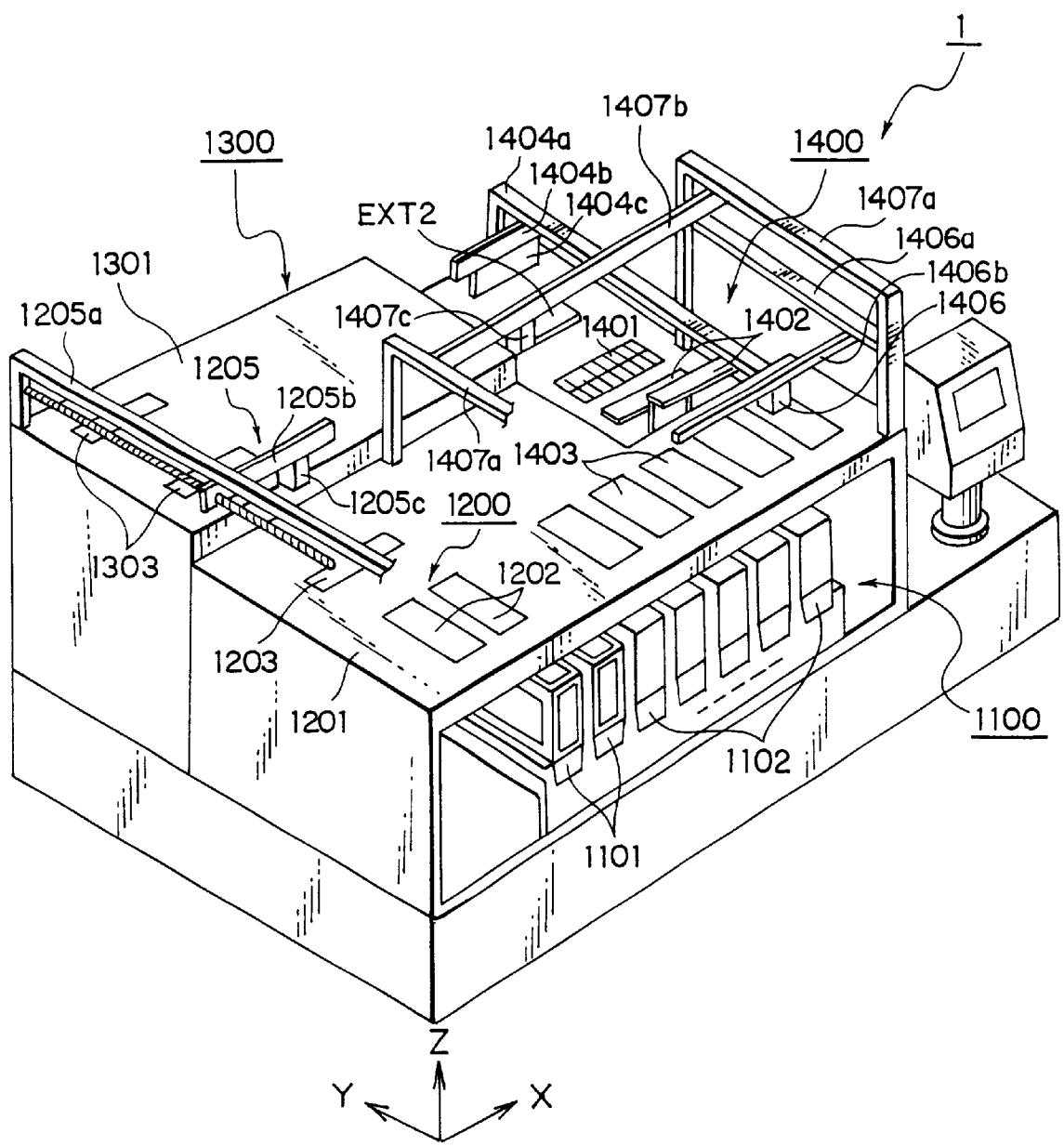
FIG. 14 is a perspective view of an electric device testing apparatus according to a third embodiment.
Figure 15:
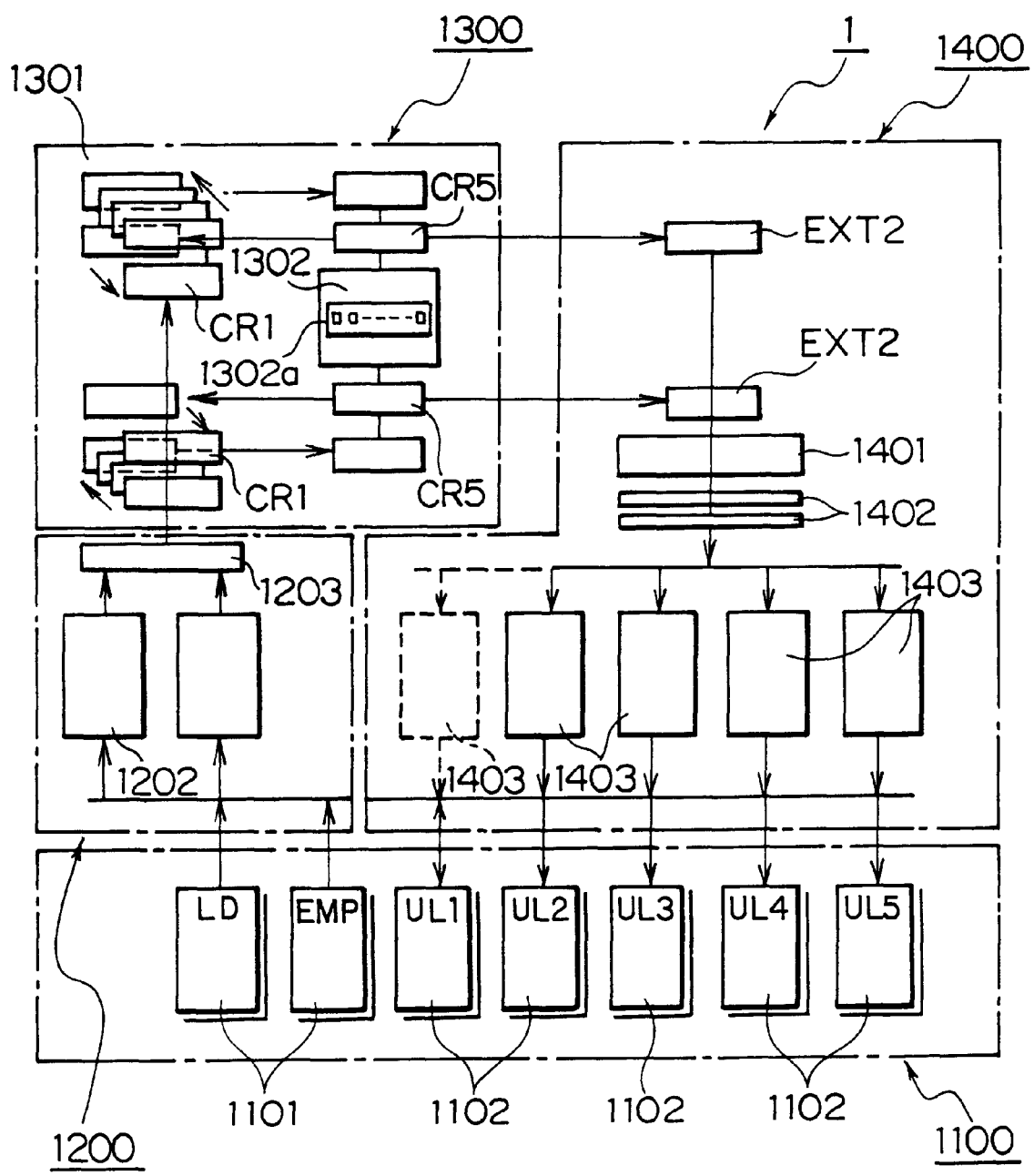
FIG. 15 is a view of a concept of handling method of an IC to be tested in the electric device testing apparatus in FIG. 14.

Therefore, the IC testing apparatus 1 of the present embodiment, as shown in FIG. 14 and FIG. 15, is comprised of an IC magazine 1100 which holds the DUTs to be tested or classifies and stores the tested DUTs, a loader section 1200 which sends the DUTs from the IC magazine 1100 into the chamber section 1300, a chamber section 1300 including a test head, and an unloader section 1400 classifying and taking out tested DUTs which had been tested in the chamber section 1300.

IC Magazine 1100

The IC magazine 1100 is provided with a pre-test IC stocker 1101 for holding DUTs to be tested and a post-test IC stocker 1102 for holding DUTs classified in accordance with the test results.

These pre-test IC stocker 1101 and post-test IC stocker 1102 are comprised of a frame-shaped tray support frame and an elevator able to enter from under the tray support frame and move toward the top. The tray support frame supports in it a plurality of stacked customer trays KT. Only the stacked customer trays KT are moved up and down by the elevator.

The pre-test IC stocker 1101 holds stacked customer trays KT on which the DUTs to be tested are held, while the post-test IC stocker 1102 holds stacked customer trays KT on which DUTs finished being tested are suitably classified.

Note that since the pre-test IC stocker 1101 and the post-test IC stocker 1102 are structured the same, the numbers of the pre-test IC stocker 1101 and the post-test IC stocker 1102 may be suitably set in accordance with need.

In the example shown in FIG. 14 and FIG. 15, the pre-test stocker 1101 is provided with one stocker LD and provided next to that with one empty stocker EMP to be sent to the unloader section 1400, while the post-test IC stocker 1102 is provided with five stockers UL1, UL2, . . . , UL5 and can hold ICs sorted into a maximum of five classes according to the test results. That is, in addition to classifying ICs as good and defective, it is possible to divide the good ICs into ones with high operating speeds, ones with medium speeds, and ones with low speeds and the defective ICs into ones requiring retesting etc.

Loader Section 1200

The above-mentioned customer tray KT is conveyed from the lower side of the test board 1201 to an opening 1202 of the loader section 1200 by a tray transfer arm (not shown) provided between the IC magazine 1100 and test board 1201. Further, in the loader section 1200, the DUTs loaded on the customer tray KT are transferred once to a pitch conversion stage 1203 by a first transfer mechanism 1204, where the mutual positions of the DUTs are corrected and their pitches are converted, then the DUTs transferred to the pitch conversion stage 1203 are reloaded on the IC carrier CR stopped at the position CR1 in the chamber section 1300 (see FIG. 17) using the second transfer mechanism 1205.

The pitch conversion stage 1203 provided on top of the test board 1201 between the window 1202 and the chamber section 1300 has relatively deep indentations. The circumferential rims of the indentations are shaped surrounded by inclined surfaces and serve to correct the positions of the ICs and convert their pitch. When a DUT picked up by the first transfer mechanism 1204 is dropped into an indentation, the drop position of the DUT is corrected by the inclined surfaces. Due to this, the mutual positions of for example four DUTs are correctly determined and even if the pitches of loading of the customer tray KT and the IC carrier CR differ, the position-corrected and pitch-converted DUTs can be picked up by the second transfer mechanism 1205 and reloaded on the IC carrier CR, whereby the DUTs can be reloaded accurately in the IC receiving indentations 14CR formed in the IC carrier CR.

Figure 16:
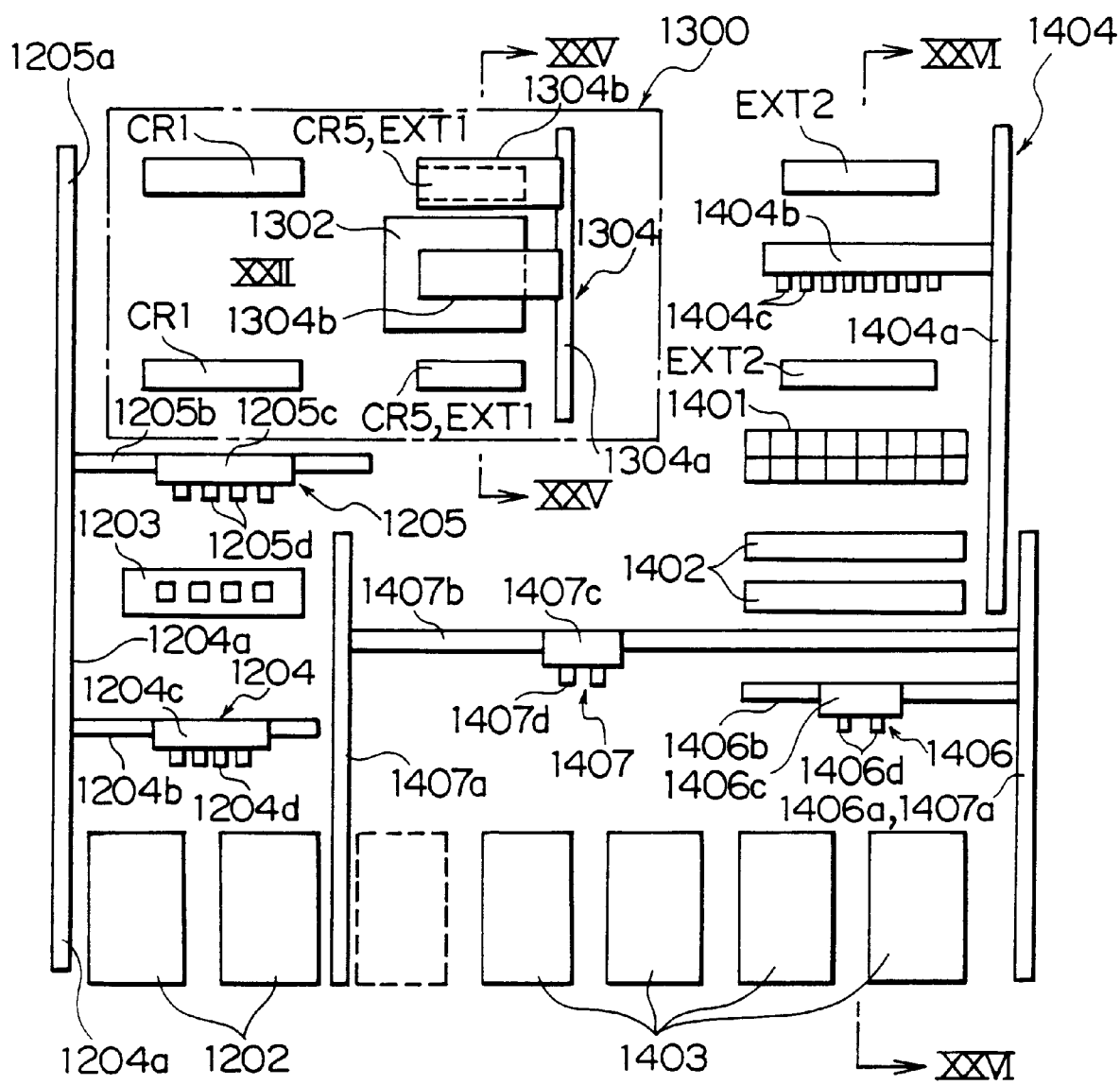
FIG. 16 is a schematic plane view of a variety of conveyers provided in the electric device testing apparatus in FIG. 14.

The first transfer mechanism 1204 for reloading the DUTs from the customer tray KT to the pitch conversion stage 1203, as shown in FIG. 16, is provided with a rail 1204a laid over the top of the test board 1201, a movable arm 1204b able to move back and forth (this direction designated as the Y-direction) between a customer tray KT and the pitch conversion stage 1203 by the rail 1204a, and a movable head 1204c supported by the movable arm 1204b and able to move in the X-direction along the movable arm 1204b.

The movable head 1204c of the first transfer mechanism 1204 has suction heads 1204d attached facing downward. The suction heads 1204d move while drawing out air to pick up the DUTs from a customer tray KT and drop the DUTs on the pitch conversion stage 1203. For example, about four suction heads 1204d are provided for the movable head 1204c, so it is possible to drop four DUTs at one time on the pitch conversion stage 1203.

On the other hand, the second transfer mechanism 1205 for reloading the DUTs from the pitch conversion stage 1203 to the IC carrier CR1 in the chamber 1300 is structured similarly. As shown in FIG. 14 and FIG. 16, it is provided with a rail 1205a laid over the top of the test board 1201, a movable arm 1205b able to move back and forth between the pitch conversion stage 1203 and the IC carrier CR1 by the rail 1205a, and a movable head 1205c supported by the movable arm 1205b and able to move in the X-direction along the movable arm 1205b.

The movable head 1205c of the second transfer mechanism 1205 has suction heads 1205d attached facing downward. The suction heads 1205d move while drawing out air to pick up the DUTs from the pitch conversion stage 1203 and reload the DUTs on the IC carrier CR1 through the entrance 1303 formed on the ceiling of the test chamber 1301. For example, about four such suction heads 1205c are provided for the movable head 1205c, so it is possible to reload four DUTs at one time on the IC carrier CR1.

Chamber Section 1300

The chamber section 1300 according to the present embodiment is provided with a constant temperature function for applying a desired high temperature or low temperature thermal stress to the DUTs loaded on the IC carrier CR. DUTs in a state given thermal stress are made to contact sections 1302a of the test head 1302 in a constant temperature state and a not shown tester performs the test.

Note that in the IC testing apparatus 1 of the present embodiment, when a low temperature thermal stress has been given to the DUTs, the ICs are heated by the later mentioned hot plate 1401 for preventing condensations on the DUTs, while when a high temperature thermal stress has been given to the DUTs, they are cooled by natural radiation of the heat. It is, however, also possible to provide a separate soaking chamber or soaking zone and cool the DUTs to room temperature by drawing in air when a high temperature has been applied or heat the DUTs by hot air or a heater etc. to return them to a temperature where condensation will not occur when a low temperature has been applied.

The test head 1302 having the contact sections 1302a is provided at the bottom of the center of the test chamber 1301. Stop positions CR5 of IC carriers CR are provided at the two sides of the test head 1302. Further, the DUTs carried on the IC carriers CR conveyed to the positions CR5 are directly carried by a third transfer mechanism 1304 to above the test head 1302, where the DUTs are tested by being made to electrically contact the contact sections 1302a.

The DUTs finished being tested are not returned to the IC carriers CR, but are reloaded on an exit carrier EXT moving into and out of the positions CR5 at the two sides of the test head 1102 and conveyed outside of the chamber section 1300. When a high temperature thermal stress had been applied, the DUTs are allowed to naturally cool after being conveyed outside of the chamber section 1300.

Figure 17:
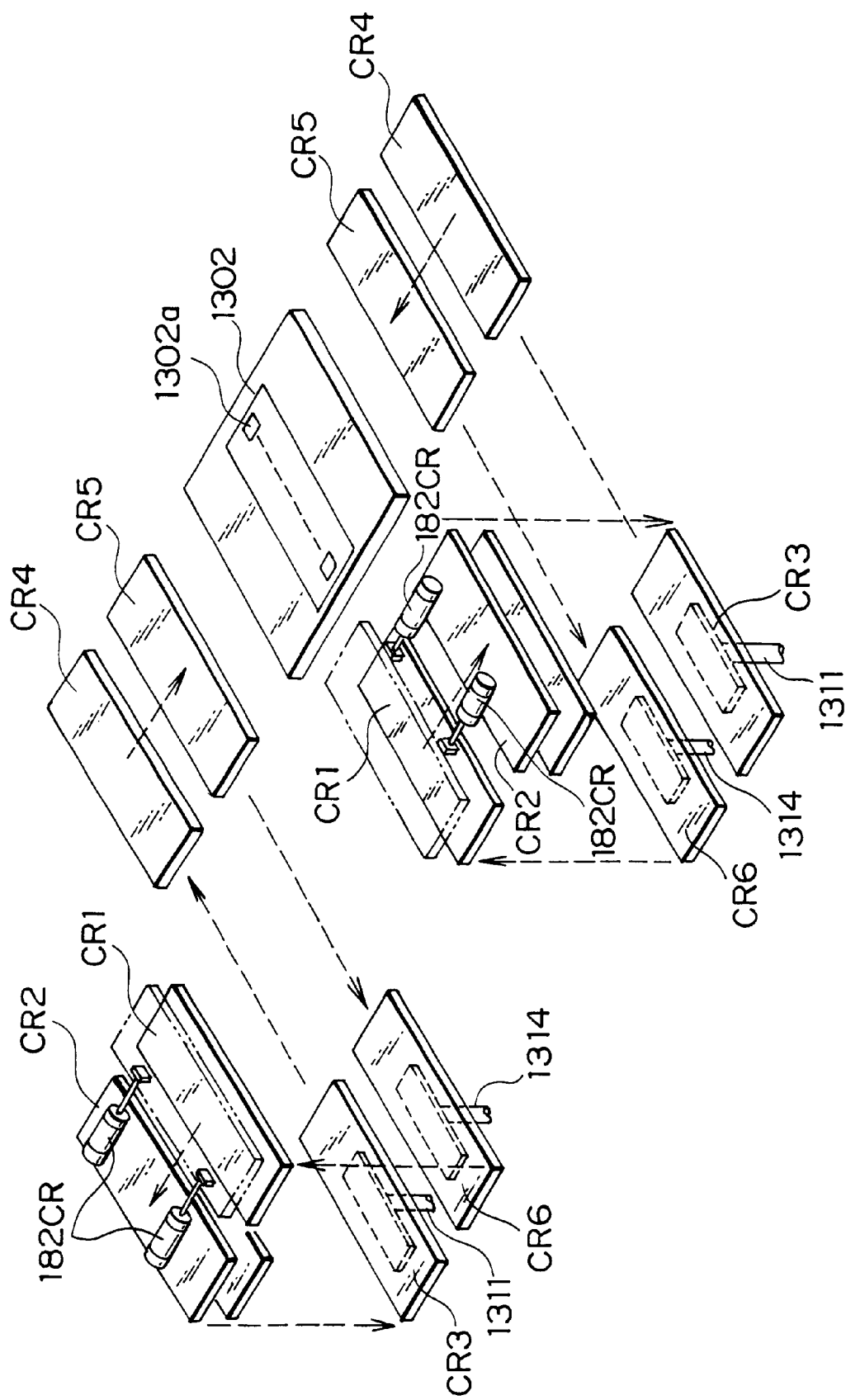
FIG. 17 is a perspective view of a core portion for explaining a transfer/carrying path/route of an IC carrier adopted in the electric device testing apparatus.

The IC carrier CR of the present embodiment is conveyed circulated inside the chamber section 1300. The state of handling is shown in FIG. 17, but in the present embodiment, first, IC carriers CR1 on which DUTs sent from the loader section 1200 are loaded are positioned near the chamber entrance of the chamber section 1300 and at the back of the chamber section 1300. The IC carriers CR at the positions CR1 are conveyed to the positions CR2 in the horizontal direction by a horizontal conveyor, not shown.

Note that the position of receiving the DUTs from the second transfer mechanism 1205 is, strictly speaking, slightly upper than the position CR1 shown in the same figure (this position is shown by a two-point dotted lines in FIG. 17). This is for the IC carrier CR to approaching the entrance 1303 formed on the ceiling of the test chamber 1301 from below in order to seal the entrance 1301 with the IC carrier CR, and for preventing heat emission inside the chamber section 1300. For this purpose, the IC carrier CR raises only a little from the position CR1 when receiving the DUTs.

Here, the IC carriers CR conveyed to the position CR2 are conveyed in a state stacked in several stages toward the bottom in the vertical direction by the elevator 1311 shown in FIG. 17. They wait until the IC carriers at the positions CR5 become empty, then are conveyed to the positions CR4 at substantially the same level as the test head 1302 from the lowermost positions CR3 by the not shown horizontal conveyer. During conveyance, a high temperature or low temperature thermal stress is applied to the DUTs.

Further, the carriers are conveyed by the not shown horizontal conveyer to the positions CR5 in the horizontal direction from the positions CR4 to the test head 1302 side, where only the DUTs are sent to the contact sections 1302a of the test head 1302. The IC carriers CR after the DUTs are sent to the contact sections 302a are conveyed from the positions CR5 to the positions CR6 in the horizontal direction by the not shown horizontal conveyer, then conveyed toward the top in the vertical direction by the elevator 1314 and returned to the original positions CR1.

In this way, the IC carriers CR are conveyed circulated only inside the chamber section 1300, so once raised or lowered in temperature, the temperatures of the IC carriers themselves are maintained as they are and as a result the heat efficiency in the chamber section 1300 is improved.

Figure 18:
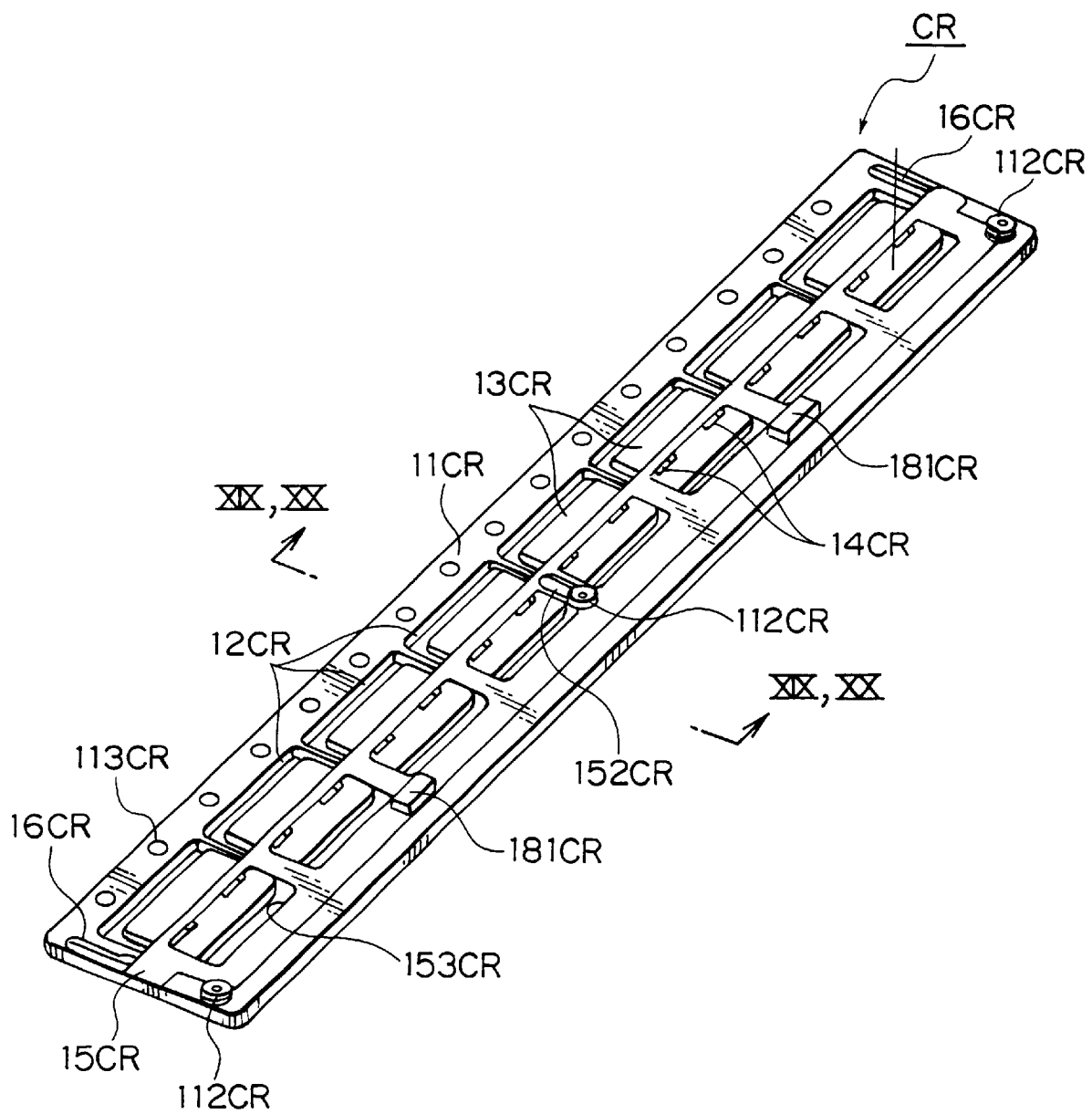
FIG. 18 is a perspective view of an embodiment of the IC carrier adopted in the electric device testing apparatus in FIG. 14.

FIG. 18 is a perspective view of the structure of an IC carrier CR in the present embodiment. Eight indentations 12CR are formed on the top surface of a strip-like plate 11CR. The indentations 12CR are respectively formed two IC holders 14CR for carrying the DUTs.

The IC holder 14CR of the present embodiment is formed for 16 along the longitudinal direction of the plate 11CR by fitting a block 13CR in the indentation 12CR, and an installation pitch $P_1$ (see FIG. 21) of the DUTs in the longitudinal direction of the plate 11CR is set at equal intervals.

In the IC holder 14CR of the present embodiment, a guide plate 17CR on which a guide hole 171CR (see FIG. 19) is formed is held between the indentation 12CR on the plate 11CR and the blocks 13CR. When, as in a ball grid array (BGA) type IC of a chip size package, the DUT cannot obtain the positioning accuracy due to its outer diameter of a package mold, it is possible to position a soldering ball terminal HB of the DUT by the circumference of the guide hole 171CR of the guide plate 17CR, and thus, the contact accuracy to the contact pin can be improved.

Figure 20:
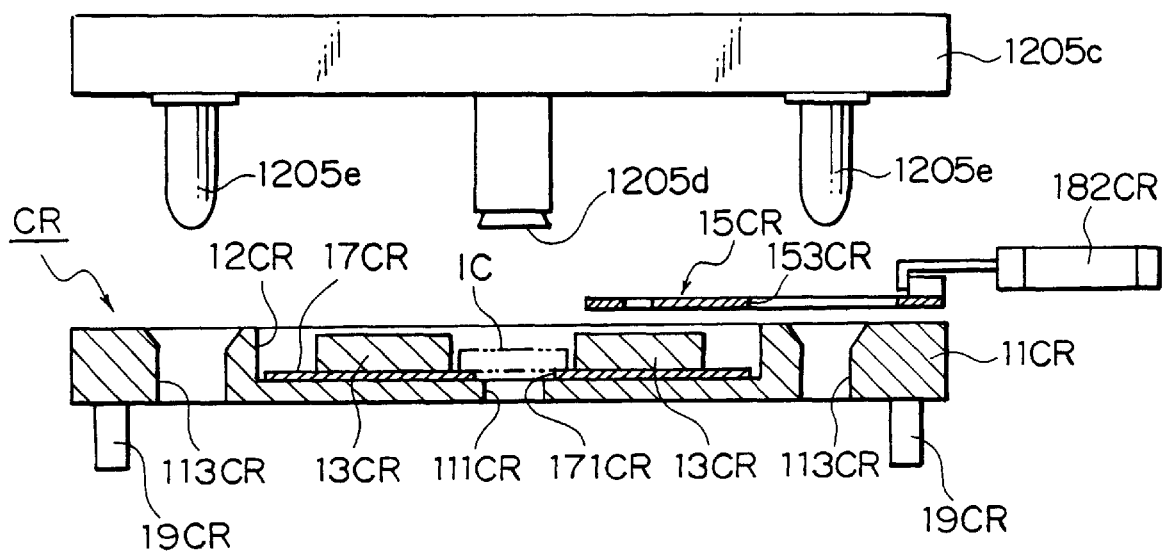
FIG. 20 is a sectional view (with the shutter open) along the line XX—XX in FIG. 18.

As shown in FIG. 18, the IC carrier CR is provided on its top surface with a shutter 15CR for preventing the DUTs received in the IC holders 14 of the IC carrier CR from deviating in position or jumping out. The shutter 15CR is opened or closed with respect to the plate 11 by springs 16CR. When the DUTs are received in the IC holders 14CR or when taking them out from the IC holders 14CR, the DUTs are put in or taken out by opening the shutter 15CR by using the shutter open/close mechanism 182CR as shown in FIG. 20.

Figure 19:
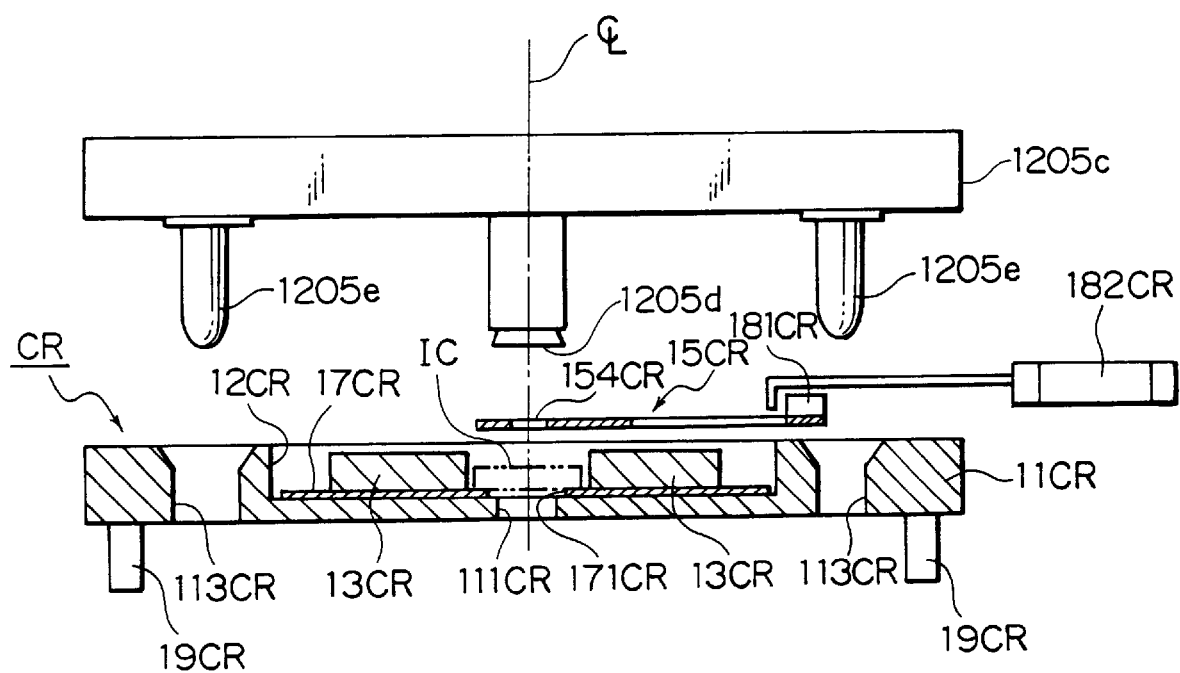
FIG. 19 is a sectional view (with a shutter closed) along the line XIX—XIX in FIG. 18.

On the other hand, when the shutter open/close mechanism 182CR is released, the shutter 15CR returns to the original state by the elasticity of the spring 16CR, and the opening surface of the IC holder 14CR of the plate 11CR is closed by the shutter 15CR as shown in FIG. 19. Thus, the DUTs held in the IC holder 14CR are held without being out or jumping out of the positions during being conveyed at a high speed.

The shutter 15CR of the present embodiment is, as shown in FIG. 18, held by three pulleys 112CR provided on the upper surface of the plate 11CR. The pulley 112CR at the center fits in the long hole 152CR formed on the shutter 15CR, and the pulleys 112CR, 112CR provided on the both ends respectively hold the both edges of the shutter 15CR.

Note that the center pulley 112CR and the long hole 152CR on the shutter 15CR are fitting to the extent of allowing almost no rattling in the longitudinal direction of the plate 11CR. While, a slight space is provided between the pulley 112CR at the end and the edge of the shutter 15CR. By doing so, even when the thermal stress acts on the IC carrier CR inside the chamber section 1300, expanding or shrinking caused therefrom is distributed to the both sides while keeping the center pulley 112CR still at the center and properly absorbed by the spaces provided at the both ends. Accordingly, the whole amount of swelling or shrinking in the longitudinal direction of the shutter 15CR becomes a half amount at the both ends, where the expanding or shrinking affects most, so the difference with that of the plate 11CR can be made small.

The shutter open/close mechanism of the present embodiment is configured as below.

First, in a routine/path of handling the IC carrier CR shown in FIG. 17, there are two positions requiring the shutter 15CR to be open, which are the position CR1 (strictly speaking, a slightly upper window 1303) for receiving the DUTs from the second transfer mechanism 1205 and the position CR5 for transferring the DUTs to the contact section 1302 of the test head 1302 by the third transfer mechanism 1304.

In the present embodiment, as shown in FIGS. 17, 19 and 20 regarding the position CR1, a fluid pressure cylinder 182CR which opens and closes by hooking the open/close block 181CR provided on the upper surface of the shutter 15CR is applied as the shutter open/close mechanism. The fluid pressure cylinder 182CR is mounted on the test chamber 1301 side. Then, as shown in FIGS. 19 and 20, by retracting the rod of the fluid pressure cylinder 182CR with respect to the IC shutter 15CR in a stopped state, the fluid pressure cylinder 182CR opens the shutter 15CR while hooking on the open/close block 181CR provided on the shutter 15CR. When loading of the DUTs completes, the shutter 15CR is closed by moving forward the rod of the fluid pressure cylinder 182CR.

On the other hand, at the position CR5 near the test head 1302, since the IC carrier CR itself is moved by the not shown horizontal conveyer, the shutter 15CR is opened or closed by using this. For example, the IC carrier CR is conveyed horizontally from the position CR4 to the position CR5. During this time, a stopper for opening or closing the shutter 15CR is provided on the test chamber 1301 side and the position contacting the open/close block 181CR of the shutter 15CR when the IC carrier CR moves from the position CR4 to position CR5. Also, the position where the stopper is provided is the position where the shutter 15CR completely opens when the IC carrier CR stops at the position CR5. In the present example, since two open/close blocks 181CR are provided on the shutter 15CR, the stopper is also provided two. Consequently, the shutter 15CR is also completely opened as the IC carrier CR is horizontally conveyed.

When conveying the IC carrier CR from the position CR5 to the position CR6, the shutter 15CR has to be closed. Therefore, by, for example, forming a cum surface on the above stopper, when the IC carrier CR is conveyed from the position CR5 to the position CR6, the rear end portion of the open/close block 181CR of the shutter 15CR keeps contacting to the cum surface and the shutter 15CR gradually closes.

Note that a positioning pin for positioning with the IC carrier CR at the time of handing over the DUTs is provided to movable heads 1205c and 1304b of the second transfer mechanism 1205 and the third transfer mechanism 1304. The movable head 1205c of the second transfer mechanism 1205 is shown as a representing example, however, the movable head 1304b of the third transfer mechanism 1304 is also configured in the same way.

As shown in the same figure, the movable head 1205c is provided with two positioning pins 1205e and 1205e straddling one DUT. Therefore, positioning holes 113CR and 113CR to be respectively fitted in by the positioning pins 1205e and 1205e are formed on the plate 11CR side of the IC carrier CR. It is not specifically limited, however, in the present example, one positioning hole 113CR (on the right in FIG. 19) is made to be a true circle, while the other positioning hole 113CR (on the left in the same figure) is made to be a long circle in the width direction. By doing so, positioning is performed mainly by one positioning hole 113CR, while the other positioning hole 113CR absorbs a position difference with the positioning pin 1205e. Also, a taper surface for leading the positioning pin 1205e is formed over the positioning hole 113CR.

Note that the reference number "153CR" in FIG. 20 is an opening portion by which the positioning pin 1205e can fit in the positioning hole 113CR when the shutter 15CR opens.

In the electric device testing apparatus 1 of the present embodiment, when all DUTs are transferred to the test head 1302 by the third transfer mechanism 1304 at the position CR5 near the test head 1302, the IC carrier CR is returned from the position CR5 to the position CR6. A remainder detection apparatus is provided for confirming that no IC holder 14CR of the IC carrier CR has a DUT left on it at this time.

The remainder detection apparatus comprises an optical electric sensor which is provided between the position CR5 and the position CR6 shown in FIG. 17 and emits and receives a detection light in the Z-axial direction along the center line CL of the IC carrier CR shown in FIG. 19. In order to let the detection light pass, through holes 111CR are respectively provided on the bottom surface of the IC holders 14CR of the plate 11CR, and through holes 154CR are provided on the shutter 15CR at positions corresponding to the respective IC holders 14CR, as well. By doing so, when the IC carrier CR moves from the position CR5 to the position CR6 after finishing handing over DUTs, a move pulse signal is received from the encoder of the horizontal conveyer, position timing of the IC holder 14CR of the IC carrier CR is confirmed thereby, and a condition of receiving the light in the optical electric sensor at the timing can be confirmed. Here, if a DUT is left in the IC holder 14CR, the light is not received by the optical electric sensor. Thus, in order to notify that there is something abnormal, for example, an alarm may be given.

Figure 21:
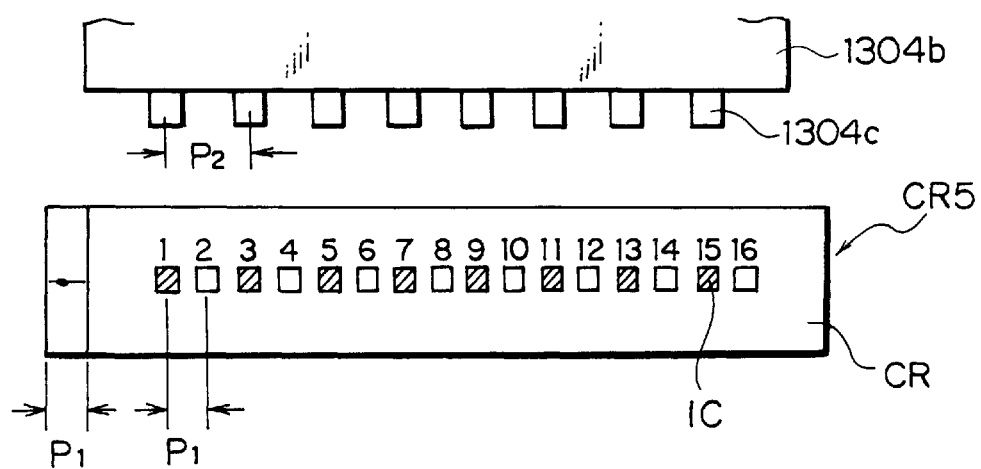
FIG. 21 is a plan view for explaining a test procedure of an IC to be tested in a test chamber of the electric device testing apparatus in FIG. 14.

The test head 1302 of the present embodiment has eight contact sections 1302a provided at predetermined pitches $P_2$. Suction heads 1304c of the contact arms are also provided at the same pitch $P_2$ as shown in FIG. 21. Further, the IC carrier CR holds 16 DUTs at the pitch $P_1$. At this time, the relationship $P_2 = 2 \cdot P_1$ stands.

The DUTs once connected to the test head 1302 are arranged in one row and 16 columns as shown in the same figure. Every other column of DUTs (portion shown by hatching) is tested simultaneously.

That is, in the first test, eight DUTs arranged in columns 1, 3, 5, 7, 9, 11, 13, and 15 are brought into contact with the contact sections 1302a of the test head 1302 for testing. In the second test, the IC carrier CR is moved by exactly one column pitch $P_1$ and the DUTs arranged in columns 2, 4, 6, 8, 10, 12, 14, and 16 are simultaneously tested in the same way. Therefore, IC carriers CR conveyed to the positions CR5 at the two sides of the test head 1302 are moved by the not shown horizontal conveyer by exactly the pitch $P_1$ in the longitudinal direction.

Note that the results of the test are stored at addresses determined by for example the identification number assigned to the IC carrier CR and the numbers of the DUTs assigned inside the IC carrier CR.

In the electric device testing apparatus 1 of the present embodiment, a third transfer mechanism 1304 is provided near the test head 1302 for transferring the DUTs to the contact sections 1302a of the test head 1302 for testing.

Figure 25A:
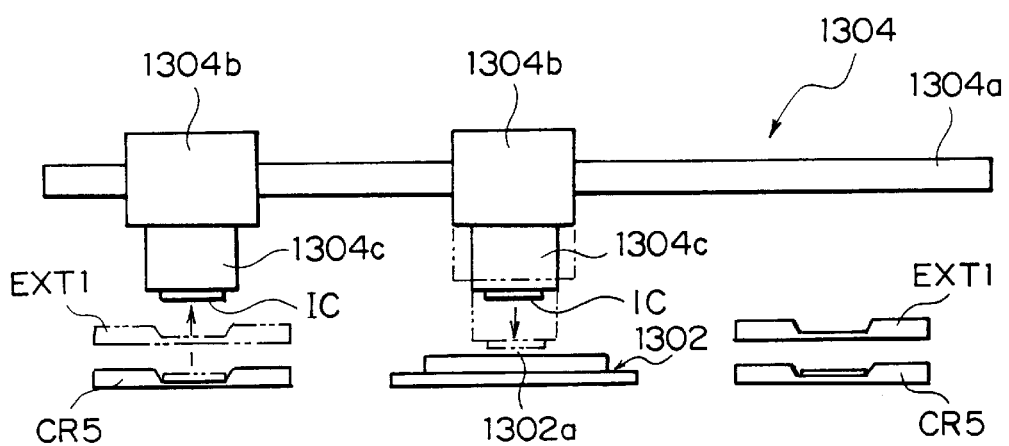
FIGS. 25A and 25B are sectional views (along the line XXV—XXV in FIG. 16) for explaining a handling method of an IC to be tested in a test chamber of the electric device testing apparatus in FIG. 14.
Figure 25B:
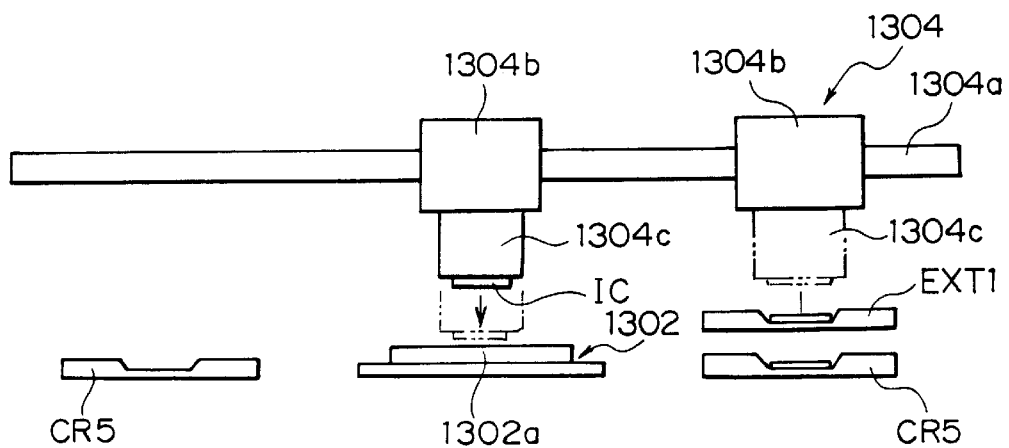

The third transfer mechanism 1304 shown in FIGS. 25A and 25B is provided with a rail 1304a provided at the stop positions CR5 of the IC carriers CR and along the direction of extension (Y-direction) of the test head 1302, a movable head 1304b able to move back and forth between the test head 1302 and the IC carriers CR by the rail 1304a, and a suction head 1304c provided facing downward at the movable head 1304b.

The suction head 1304c is comprised to be able to move in the vertical direction by a not shown drive (for example, fluid pressure cylinder). The vertical movement of the suction head 1304c enables the DUTs to be picked up and the DUTs to be pushed against the contact section 1302a.

The suction head 1304c of the present embodiment will be explained further in detail.

Figure 22:
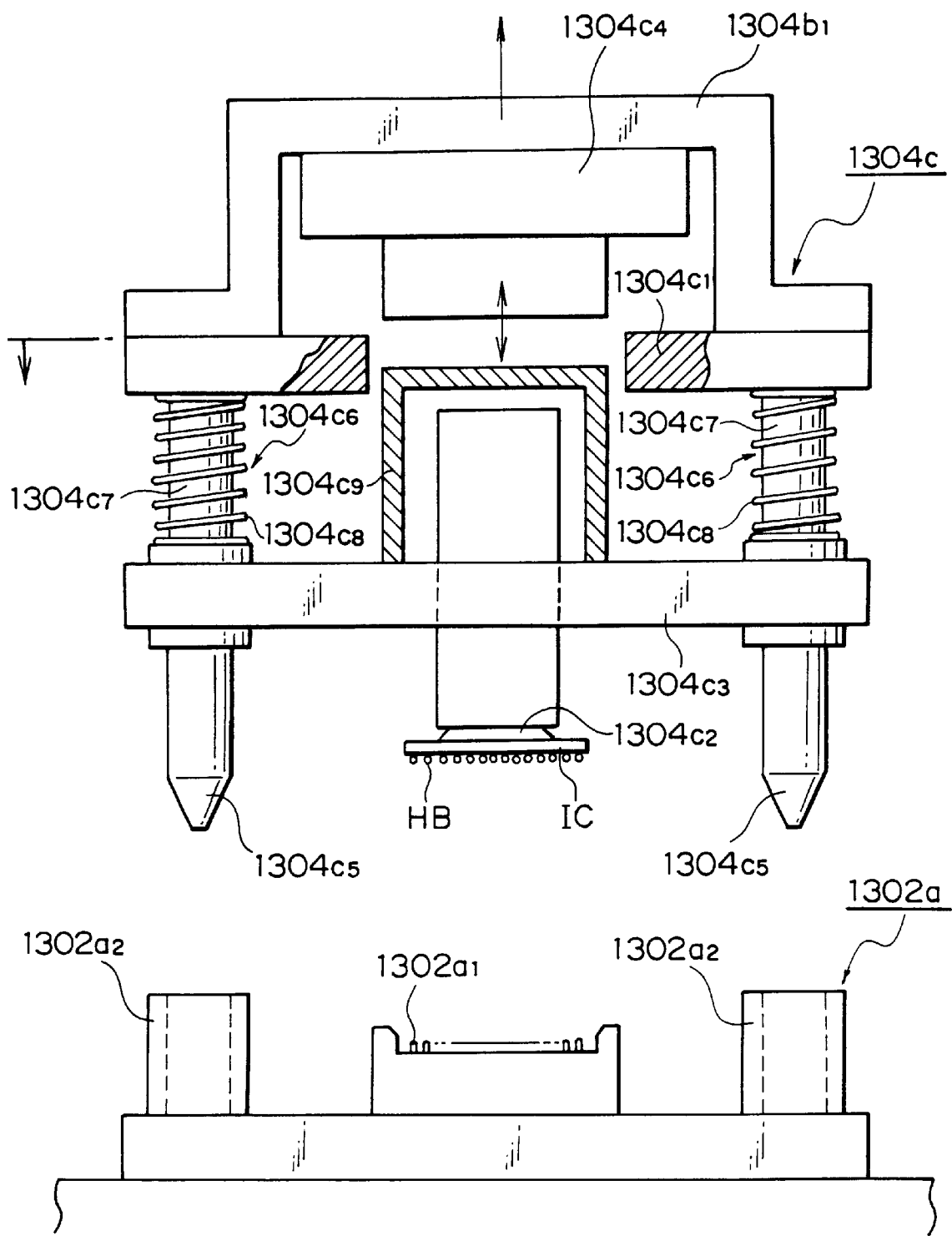
FIG. 22 is a front view (from an arrow XXII in FIG. 16) of an embodiment of a suction device of the present invention.
Figure 23:
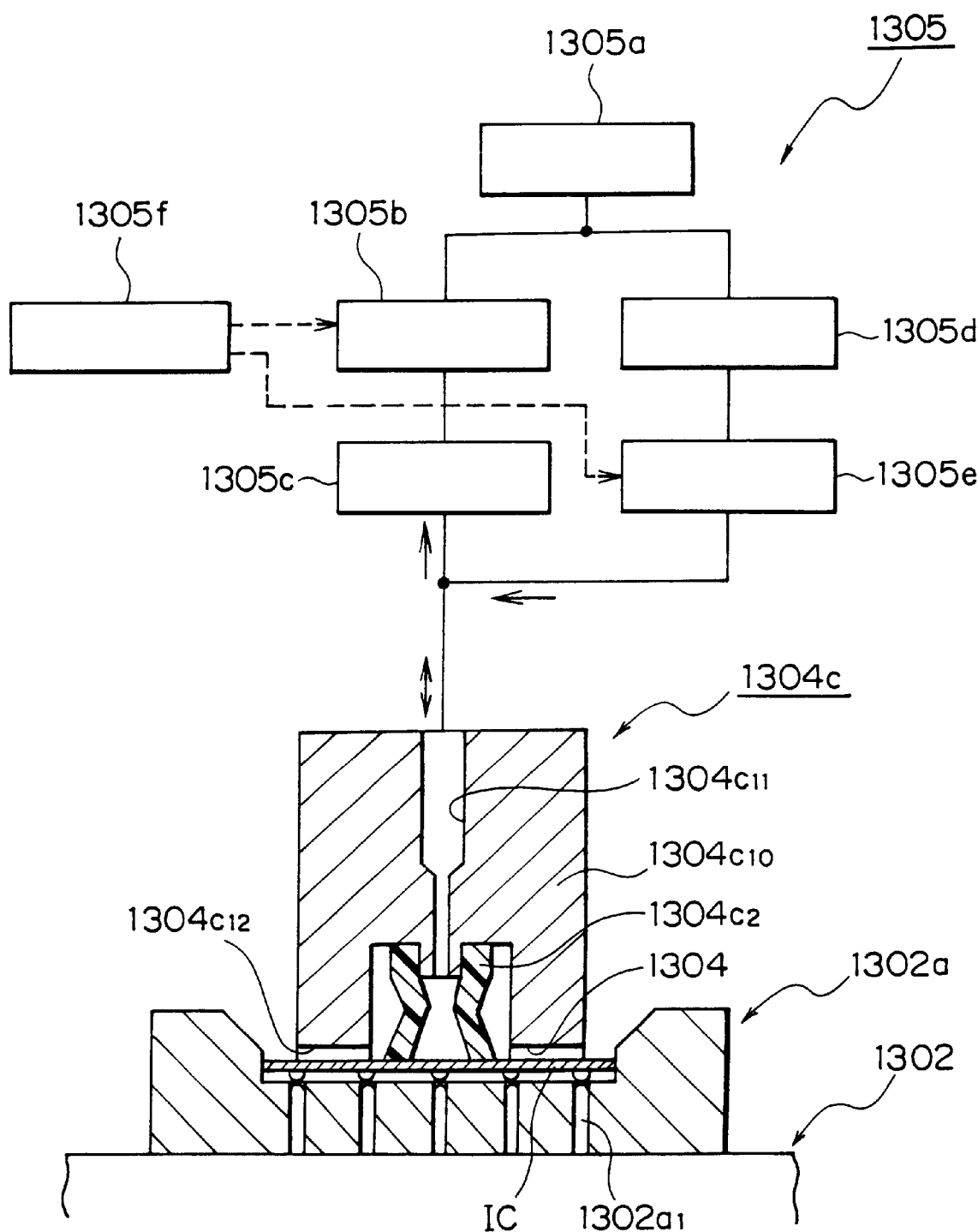
FIG. 23 is a sectional view of a core portion and a circuit block of an embodiment of the suction device.

As shown in FIGS. 22 and 23, the suction head 1304c is provided on a not shown Z-axial drive, and comprises a pusher base 1304c1 moving upward and downward with respect to the contact section 1302a and a movable base 1304c3 mounted to the pusher base 1304c1 via a floating mechanism 1304c6. The movable base 1304c3 has a suction pad 1304c2 fixed to it for picking up a DUT.

Figure 24:
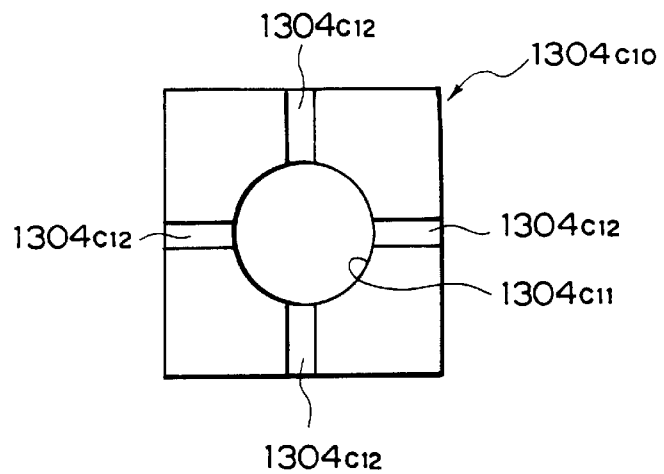
FIG. 24 is a view from the bottom of a suction surface of the suction head shown in FIG. 23.

The above state is shown in FIGS. 23 and 24. The suction head 1304c10 fixed to the movable base 1304c3 is approximate rectangular parallelepiped shape and a through hole 1304c11 for vacuum is formed therein. Also, the suction pad 1304c2 composed of an elastic body is fixed to inside the suction head body 1304c10, and a suction force at the time of vacuum is given to the tip of the suction pad 1304c2.

On the suction surface of the suction head body 1304c10 is formed a plurality (here, it is four) of grooves 1304c12 as shown in FIG. 24, which connects the through hole 1304c11 of the suction head body 1304c10 with the outside in the condition that a DUT is pushed against the contact section 1302a as shown in FIG. 23. Note that the shape and amount of the grooves 1304c12 shown in FIG. 24 are shown only as an example and may be properly changed in accordance with conditions, such as a self-heating amount of the DUT and an air temperature, etc.

The suction head 1304c is provided with an air pressure circuit 1305 shown in the same figure. In the air pressure circuit 1305, an air source 1305a (corresponding to the fluid supply source of the present invention), such as a plant air (air pipe system laid inside a plant), exclusive compressor, an ejector 1305c for performing vacuum using a compressed air as a drive source, and an ejector valve 1305b for turning on/off the ejector 1305c are connected in series. The suction force generated by the circuit is given to the suction pad 1304c2 via the through hole 1304c11 of the suction head 1304c.

A crush valve 1305e is provided to a circuit in parallel branched from the air source 1305a and its end is also connected to the through hole 1304c11 of the suction head 1304c. The crush valve 1305e supplies the compressed air from the air source 1305a to the suction pad 1304c2 by opening, and thereby, has a function of releasing the DUT adhered to the suction pad 1304c2. Namely, the crush valve 1305e is momentary opened at releasing the DUT.

Especially in the present embodiment, the compressed air from the crush valve 1305e is used for releasing the heat due to self-heating during testing a DUT. Namely, control of opening/closing of the ejector valve 1305b at the time of vacuum and opening/closing of the crush valve 1305e at the time of releasing the DUT are performed by an instruction signal (may be electric, air pressure, or oil pressure) from the control apparatus 1305f. The crush valve 1305e is closed and ejector valve 1305b is opened when holding a DUT by suction, and the ejector valve 1305b closes when the held DUT is pushed against the contact section 1302a.

At this time, since the DUT is fixed by the suction head 1304c and the contact section 1203a, the air source is left unused. Accordingly, the crush valve 1305e is made open while the ejector valve is made closed and the compressed air from the air source 1305a is blown to the DUT via the through hole 1304c11. By doing so, the compressed air which generally is made to be a normal temperature is blown to the DUT and flows through the grooves 1304c12 formed on the suction surface, so even a self-heated DUT can be cooled.

At this time, though not specifically limited, it is preferable to provide a temperature control unit 1305d for controlling the temperature of the compressed air in the circuit of the crush valve 1305e as shown in FIG. 23 in order to make the temperature of the air blown to the DUT at an appropriate value in accordance with the self-heating amount and a test temperature.

Note that when blowing the compressed air to the DUT, the crush valve 1305e is not always required to be open, and a flow amount can be controlled by, for example, a duty ratio of on and off.

A floating mechanism 1304c6 provided between a pusher base 1304c1 and a movable base 1304c3 is configured as below. First, a guide pin 1304c5 to be fitted in a later explained guide bush 1302a2 as one guide means is fixed to the movable base 1304c3 at its center portion and the bottom end is inserted to a pin of a small diameter 1304c7 fixed to the pusher base 1304c1. As a result, the movable base 1304c3 is movable for the amount of a space between the guide pin 1304c5 and the small diameter pin 1304c on the X-Y plane with respect to the pusher base 1304c1.

Furthermore, the movable base 1304c3 is movable upward in the Z-axial direction with respect to the pusher base 1304c1, however, the movable base 1304c3 is biased in the direction separating from the pusher base 1304c1 by the spring 1304c8 provided between the pusher base 1304c1 and a movable base 1304c3. Accordingly, the condition shown in FIG. 22 is maintained during when an external force does not act, while the movable base 1304c3 moves with respect to the pusher base 1304c1 on the X-Y plane when an external force acts in the X-direction or Y-direction at the time of fitting the guide pin 1304c5 and the guide bush 1302a2. Also, if the X-Y plane is inclined when a later explained fluid pressure cylinder 1304c4 pushes against the movable base 1304c3 via the pushing block 1304c9, posture of the movable base with respect to the pusher base 1304c1 is changed resisting to the elasticity of the spring 1304c8.

In the suction head 1304c of the present invention, a fluid pressure cylinder 1304c1 is fixed to a base 1304b1 on which the pusher base 1304c1 is mounted, the pushing block 1304c9 is mounted to the movable base 1304c3, the tip of the rod of the fluid pressure cylinder 1304c4 contacts and pushes against the upper surface of the pushing block 1304c9, and the movable base 1304c3 is pushed through this.

The suction head 1304c of the present embodiment is provided with eight movable bases 1304c3 to be mutually independently floating with respect to one common pusher base 1304c1, and the above fluid pressure cylinders 1304c4 are also provided at mutually independent positions (base 1304b1) with respect to the respective movable bases.

Note that a guide pin 1304c5 having its tip a taper surface is fixed to the movable base 1304c3 and the guide bush 1302a2 is fixed to the contact section 1302a the guide pin 1304c5 and the guide bush 1302a2 compose a guide means of the present invention. By fitting the guide pin 1304c5 is fitted in the guide bush 1302a2 from the taper surface when the suction head 1304c descends toward the contact section 1302a, the movable base 1304c3 is performed positioning with respect to the contact section 1302a.

Also, when changing the kind of contact section 1302a as the kind of DUT is changed, the kind of suction head 1304c is also changed. In the present embodiment, the parts lower than the pusher base 1304c1 are exchanged as a change kit and the base 1304b1 and fluid pressure cylinder 1304c4 are used as they are. As a result, components of the change kit become minimum, the cost can be reduced, and the changing work performance can be improved as the weight of the change kit becomes minimum.

In the third transfer mechanism 1304 of the present embodiment, as shown in FIGS. 25A and 25B, two movable heads 1304b are provided on a single rail 1304a. The interval between them is set equal to the interval between the test head 1302 and the stop positions CR5 of the IC carriers CR. These two movable heads 1304b move simultaneously in the Y-direction by a single drive source (for example, ball-screw mechanism), while the suction heads 1304c move in the vertical direction by independent drives.

As explained above, the suction heads 1304c can pick up and hold eight DUTs at one time and the interval between them is set equal to the interval between contact sections 1302a. The operation of the third transfer mechanism 1304 will be explained in detail below.

Unloader Section 1400

The unloader section 1400 is provided with an exit carrier EXT for ejecting the tested DUTs from the chamber section 1300. The exit carrier EXT is comprised so as to be able to move back and forth in the X-direction between the positions EXT1 at the two sides of the test head 1302 and the position EXT2 of the unloader section 1400 as shown in FIGS. 16, 25A and 25B. At the positions EXT1 at the two sides of the test head 1302, as shown in FIGS. 25A and 25B, it appears and retracts superposed somewhat above the stop position CR5 of the IC carrier and somewhat below the suction head 1304c of the third transfer mechanism 1304.

The specific structure of the exit carrier EXT is not particularly limited, but it can be configured by a plate formed on it a plurality of indentations able to receive the DUTs (here, eight) such as the IC carrier CR shown in FIG. 18.

A total of two exit carriers EXT are provided at the two sides of the test head 1302. They operate substantially symmetrically with one moving to the position EXT2 of the unloader section 1400 while the other is moving to the position EXT1 of the test chamber 1301.

Returning to FIG. 16, a hot plate 1401 is provided close to the position EXT2 of the exit carrier EXT in the electric device testing apparatus 1 of the present embodiment. The hot plate 1401 is for heating the DUTs up to a temperature of an extent not causing condensation when a low temperature thermal stress has been applied to the DUTs. Therefore, there is no need to use the hot plate 1401 when a high temperature thermal stress has been applied.

The hot plate 1401 of the present embodiment is designed to be able to hold two columns and 16 rows of DUTs, a total of 32, corresponding to the ability of the suction heads 1404d of the later mentioned fourth transfer mechanism 1404 capable of holding eight DUTs at one time. The hot plate 1401 is divided into four regions corresponding to the suction heads 1404d of the fourth transfer mechanism 1404. The eight DUTs picked up and held from the exit carrier EXT2 are placed on these regions in order. The eight DUTs heated the longest are picked up by the suction heads 1404d and transferred in that state to the buffer section 1402.

Figure 26:
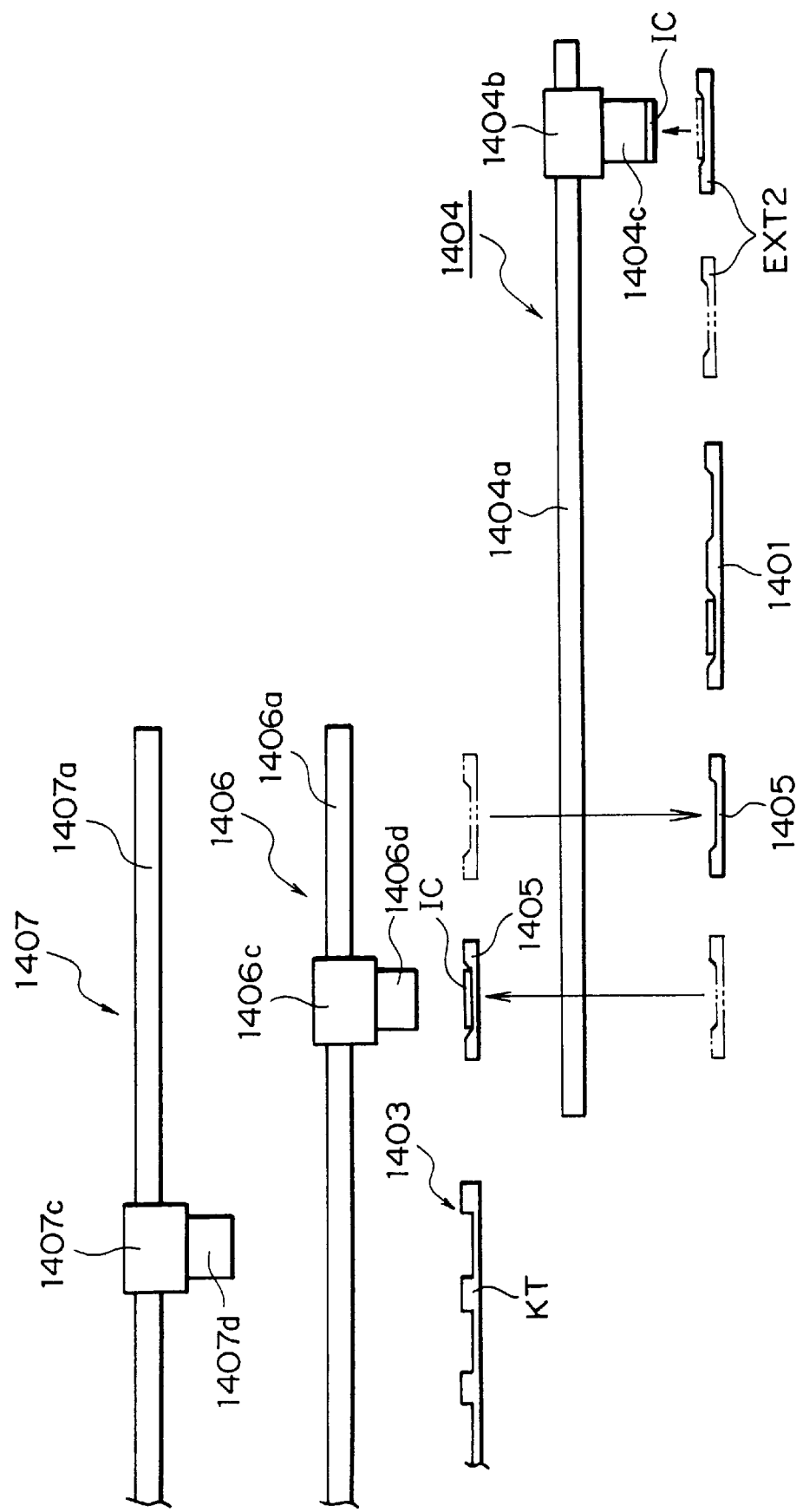
FIG. 26 is a sectional view for explaining a handling method of an IC to be tested in an unloader section in the electric device testing apparatus in FIG. 14.

Near the hot plate 1401 are provided two buffer sections 1402 each having an elevator table 1405. FIG. 26 is a sectional view along the line XXVI—XXVI of FIG. 16. The elevator tables 1405 of the buffer sections 1402 move in the Z-direction between a level position the same as the exit carriers EXT2 and the hot plate 1401 (Z-direction) and a level position above the same, specifically the level position of the test board 1201. The specific structure of the buffer sections 1402 is not particularly limited, but for example the section can be configured by a plate formed on it a plurality of (here, eight) indentations able to hold the DUTs in the same way as the IC carriers CR and the exit carriers EXT.

This pair of elevator tables 1405 operate substantially symmetrically, that is, while one is stopped at the elevated position, the other is stopped at the descended position.

The unloader section 1400 stretching from the exit carriers EXT2 to the buffer sections 1402 explained above is provided with a fourth transfer mechanism 1404. The fourth transfer mechanism 1404, as shown in FIG. 16 and FIG. 26, is provided with a rail 1404a laid above the test board 1201, a movable arm 1404b able to move in the Y-direction between the exit carriers EXT2 and buffer sections 1402 by the rail 1404a, and a suction head 1404c supported by the movable arm 1404b and able to move vertically in the Z-direction with respect to the movable arm 1404b. The suction head 1404c draws out air and moves in the Z-direction and Y-direction and therefore can pick up a DUT from an exit carrier EXT and drop the DUT to the hot plate 1401 and also can pick up a DUT from the hot plate 1401 and drop the DUT to a buffer section 1402. There are eight suction heads 1404c attached to the movable arm 1404b in this embodiment, therefore it is possible to transport eight DUTs at one time.

Note that, as shown in FIG. 26, the movable arm 1404b and the suction heads 1404c are set at positions enabling them to pass through a level position between the elevated position and descended position of the elevator tables 1405 of the buffer sections 1402. By this, even if one elevator table 1405 is at its elevated position, it is possible to transfer the DUTs to the other elevator table 1405 without interference.

Further, the unloader section 1400 is provided with a fifth transfer mechanism 1406 and a sixth transfer mechanism 1407. These third and sixth transfer mechanisms 1406 and 1407 reload the tested DUTs carried out to the buffer sections 1402 to the customer trays KT.

Therefore, the test board 1201 is formed with a total of four openings 1403 for arranging the empty customer trays KT carried from the empty stocker EMP of the IC magazine 1100 to be close to the top surface of the test board 1201.

The fifth transfer mechanism 1406, as shown in FIGS. 14, 16 and 26, is provided with a rail 1406a laid above the test board 1201, a movable arm 1406b which can move in the Y-direction between the buffer sections 1402 and openings 1403 by the rail 1406a, a movable head 1406c which is supported by the movable arm 1406b and can move in the X-direction with respect to the movable arm 1406b, and a suction head 1406d which is attached to the movable head 1406c facing downward and can move vertically in the Z-direction. The suction head 1406d draws out air and moves in the X-, Y-, and Z-directions and thereby picks up a DUT from the buffer section 1402 and transfers the DUT to a customer tray KT of a corresponding category. Two suction heads 1406d are attached to the movable head 1406c in this embodiment so it is possible to transfer two DUTs at one time.

Note that the fifth transfer mechanism 1406 of the present embodiment is formed with a short movable arm 1406b so as to transfer DUTs only to customer trays KT set at the two openings 1403 at the right end. This is effective when setting customer trays KT of categories with high frequencies of occurrence at the two openings 1403 at the right end.

As opposed to this, the sixth transfer mechanism 1406, as shown in FIGS. 14, 16, and 26, is provided with two rails 1407a, 1407a laid above the test board 201, a movable arm 1407b which can move in the Y-direction between the buffer sections 1402 and openings 1403 by these rails 1407a, 1407a, a movable head 1407c which is supported by the movable arm 1407b and can move in the X-direction with respect to the movable arm 1407b, and a suction head 1407d which is attached to the movable head 1407c facing downward and can move vertically in the Z-direction. The suction head 1407d draws out air and moves in the Y- and Z-directions and thereby picks up a DUT from the buffer section 1402 and transfers the DUT to a customer tray KT of a corresponding category. Two suction heads 1407d are attached to the movable head 1407c in this embodiment so it is possible to transfer two DUTs at one time.

The above-mentioned fifth transfer mechanism 1406 can transfer DUTs to only customer trays KT set at the two openings 1403 at the right end, while the sixth transfer mechanism 1407 can transfer DUTs to customer trays KT set at all of the openings 1403. Therefore, DUTs of categories with high frequencies of occurrence may be classified using the fifth transfer mechanism 1406 and the sixth transfer mechanism 1407 and DUTs of categories with low frequencies of occurrence may be classified by only the sixth transfer mechanism 1407.

To prevent the suction heads 1406d, 1407d of the two transfer mechanisms 1406, 1407 from interfering with each other, as shown in FIG. 14 and FIG. 26, these rails 1406a, 1407a are provided at different heights so that even if two suction heads 1406d, 1407d operate simultaneously, there will be almost no interference. In this embodiment, the fifth transfer mechanism 1406 is set at a position lower than that of the sixth transfer mechanism 1407.

Note that while not shown, elevator tables for elevating or lowering customer trays KT are provided below the test board 1201 of the openings 1403. A customer tray KT becoming full after being reloaded with the tested DUTs is placed on there and lowered, the full tray is passed to the tray transfer arm, and the tray transfer arm is used to carry it to the corresponding stocker UL1 to UL5 of the IC magazine 1100. Further, an empty customer tray KT is carried from the empty stocker EMP by the tray transfer arm to an opening 1403 which has become empty after the ejection of a customer tray KT, placed on the elevator table, and set at the window 1403.

One buffer section 1402 of the present embodiment is able to hold 16 DUTs. Further, provision is made of a memory for storing the categories of the DUTs held at the IC holding positions of the buffer section 1402.

Further, the categories and positions of the DUTs stored at the buffer section 1402 are stored for each DUT, customer trays KT of categories to which the DUTs stored at the buffer section 1402 belong are called up from the IC magazine 1100 (UL1 to UL5), and the DUTs are received in the corresponding customer trays KT by the above-mentioned third and sixth transfer mechanisms 1406, 1407.

The stocker LD of the IC magazine 1100 holds customer trays KT carrying DUTs to be tested. A customer tray KT is set at an opening 1202 of the loader section 1200. For example four DUTs to be tested are picked up at once using the first transfer mechanism 1204 from the customer tray KT brought close to the top surface of the test board 1201. These are dropped onto the pitch conversion stage 1203 once where the DUTs are corrected in position and converted in pitch.

Next, the second transfer mechanism 1205 is used to pick up for example four DUTs dropped at the pitch conversion stage 1203 at once, carry them from the entrance 1303 to inside the test chamber 1301, and place them on an IC carrier CR stopped at the position CR1. In the test chamber 1301, two positions CR1 are provided, so the second transfer mechanism 1205 conveys the DUTs alternately to IC carriers CR at these two locations. At this time, the shutter 15CR of the IC carrier CR opens or closes by the fluid pressure cylinder 182CR (see FIG. 17).

If 16 DUTs are loaded at these positions CR1, the IC carrier CR is conveyed into the test chamber 1301 by the route CR1→CR2→ . . . →CR4 shown in FIG. 17. During this time, a high temperature or low temperature thermal stress is given to the DUTs.

When IC carriers CR on which DUTs to be tested are loaded are carried to the positions CR5 at the two sides of the test head 1302, as shown in FIG. 25A, the shutter 15CR of the IC carrier CR opens by a not shown stopper and one group of suction heads (here, on the left side) 1304c of the third transfer mechanism 1304 descends and picks up every other DUT (see FIG. 21), then again rise and stand by there. Simultaneously with this, the other group of suction heads (here, on the right side) 1304c pushes the eight DUTs picked up against the contact sections 1302a of the test head 1302 for the test. Note that when picking up and holding the DUTs, an instruction signal is sent from the control apparatus 1305f to the ejector valve 1305b and the crush valve 1305e as shown in FIG. 23, and the crush valve 1305e is closed while the ejector valve 1305b is opened.

At this time, there is no exit carrier EXT (shown by two-dot chain line) above the IC carrier CR5 at the left side. It is moved to the position EXT2 outside the test chamber 1301. Further, there is an exit carrier EXT at EXT1 above the IC carrier CR5 at the right side. This stands by until the tests on the DUTs picked up by the suction heads 1304c of the right side are completed.

As shown in FIG. 22, the suction head 1304c wherein eight DUTs are picked up by the suction pad 1304c2 descends as a whole by the not shown Z-axial drive. During this time, as a result of the guide pin 1304c5 being fitted in the guide bush 1302a2, the movable base 1304c3 floats to an appropriate position with respect to the contact section 1302a.

Around the time when a soldering ball terminal HB of a DUT contacts the contact pin 1302a1 of the contact section 1302a, the upper surface of the movable base 1304c3 is pushed via the pushing block 1304c9 by moving forward the rod end by operating the fluid pressure cylinder 1304c4. Due to the pushing operation, even if the pusher base 1304c1 of the suction head 1304c as a whole is deformed due to thermal stress or defect in processing, it can be absorbed and the pushing force at the respective soldering ball terminals HB of the DUTs against the respective contact pins 1302a1 are made to be almost uniform.

Also, when the DUT is pushed against the contact section 1302a, the vacuum performed up to then becomes unnecessary, so the control apparatus 1305f sends an instruction signal to the ejector valve 1305b and the ejector valve 1305b is closed.

Then, the crush valve 1305e is opened while the ejector valve 1305b is kept closed, and the compressed air from the air source 1305a is blown to the DUT via the through hole 1304c11. As a result, the compressed air which generally is made to be a normal temperature is blown to the DUT and flows through the grooves 1304c12 formed on the suction surface, so even a self-heated DUT can be cooled down.

When the tests on the eight DUTs picked up by the right side suction heads 1304c are completed, as shown in FIG. 25B, the movable head 1304b, 1304b are moved to the right side and the eight DUTs picked up by the left side suction heads 1304c are pushed against the contact sections 1302a of the test head 1302 for testing.

On the other hand, the eight tested DUTs picked up by the left side suction heads 1304c are loaded on the standing by exit carrier EXT, then the exit carrier EXT loaded with the tested DUTs is moved from the position EXT1 inside the test chamber 1301 to the position EXT2 outside the test chamber 1301.

When the exit carrier EXT is moved outside of the test chamber 1301 in this way, the right side suction heads 1304c descend to the IC carrier CR at the position CR5 pick up the remaining eight DUTs, rise again, then stand by until the tests on the DUTs picked up by the left side suction heads 1304c are completed. Before the suction heads 1304c pick up the DUTs, the IC carrier CR moves by exactly a pitch $P_1$ (see FIG. 21) so as to enable the remaining DUTs to be picked up by the suction heads 1304c.

About the same time as this, the left side exit carrier EXT moves inside the test chamber 1301 and stands by at the position EXT1 until the tests on the DUTs picked up by the left side suction heads 1304c are completed.

In this way, when the tests on the DUTs picked up by the left side suction heads 1304c are completed the movable heads 1304b, 1304b are moved to the left side and the remaining DUTs picked up by the right side suction heads 1304c are pushed against the contact sections 1302a of the test head 1302 for testing.

On the other hand, the eight tested DUTs picked up by the left side suction heads 1304c are loaded on the exit carrier EXT then standing by, then the exit carrier EXT on which the tested DUTs are loaded is moved from the position EXT1 inside the test chamber 1301 to the position EXT2 outside the test chamber 1301.

This operation will be repeated after this, but since one contact section 1302a is alternately accessed by two groups of suction heads 1304c with one standing by for the tests of the others to be completed, the time for a DUT to be picked up by one suction head 1304c is absorbed in another test time and the eject time can be shortened by that amount.

The DUTs after being tested at the test head 1302 are ejected for eight at a time to the position EXT2 outside of the test chamber 1301 by the two exit carriers EXT.

As shown in FIG. 26, when tested DUTs ejected to the right side position EXT2 by the exit carrier EXT are all picked up by the suction heads 1404c of the fourth transfer mechanism 1404 and loaded on one of the four regions of the hot plate 1401. Note that a case where a low temperature thermal stress is applied will be explained in the present embodiment below, while when a high temperature thermal stress is applied, the DUTs are directly carried to the buffer portion 1402 from the exit carrier EXT.

The suction heads 1404c of the fourth transfer mechanism 1404 which carried the tested DUTs to one region on the hot plate 1401 do not return to the original position pick up eight ICs heated the longest time among the DUTs placed on the hot plate 1401 at that position and reload the heated tested DUTs on the elevator table 1405 (on the right here) of the buffer section 1402 at the descended position.

As shown in FIG. 26, the left elevator table 1405 loaded with eight DUTs by the previous operation of the fourth transfer mechanism 1404 moves to the elevating position, while along with this, the right elevator table 1405 moves to the descending position. Eight DUTs are loaded on the left elevator table moved to the elevating position and the DUTs are transferred by the fifth and sixth transfer mechanisms 1406 and 1407 to customer trays of corresponding categories in accordance with the stored content of the test results. FIG. 26 is an example of reloading a tested DUT to the customer tray by the fifth transfer mechanism 1406.

By repeating this operation below, the DUTs are reloaded to the customer tray KT of the corresponding category, but by arranging the fourth transfer mechanism 1404 and the fifth or sixth transfer mechanisms 1406, 1407 at different level positions in the unloader section 1400, it is possible to make the fourth transfer mechanism 1404 and the first and sixth transfer mechanisms 1406, 1407 simultaneously operate and thereby improve the throughput.

Note that the embodiments explained above were described to facilitate the understanding of the, present invention and not to limit the present invention. Accordingly, elements disclosed in the above embodiments include all design modifications and equivalents belonging to the technical field of the present invention.

What is claimed is:

1. An electric device testing apparatus comprising:
    a test tray on which electric devices to be tested are held and which is carried in the electric device testing apparatus;
    a connection terminal to which the electric device to be tested is removably connected in a state of being held on said test tray;
    a pusher for pushing the electric device in the state of being held on the test tray against said connection terminal in order to connect the electric device to said connection terminal, the pusher having a ventilation hole; and
    means for adjusting a temperature of the electric device which generates heat by itself during a test on the electric device via the hole formed on said pusher, the temperature adjusting means includes temperature adjusted gas supply means for blowing a temperature adjusted gas directly to the electric device under test in the state of being held on the test tray via the ventilation hole.

2. An electric device testing apparatus comprising:
    a test tray on which electric devices to be tested are held and which is carried in the electric device testing apparatus;
    a connection terminal to which the electric device to be tested is removably connected in a state of being held on said test tray;
    a pusher for pushing the electric device in the state of being held on the test tray against said connection terminal in order to connect the electric device to said connection terminal, the pusher having a drawing hole; and
    means for adjusting a temperature of the electric device which generates heat by itself during a test on the electric device via the hold formed on said pusher, and said temperature adjusting means includes air drawing means for drawing an air around the electric device during the test on the electric device which is held on the test tray via the drawing hole.

3. The electric device testing apparatus as set forth in any one of claims 1 or 2, wherein said pusher is provided with a temperature sensor capable of detecting a temperature of at least one of the electric device and an atmosphere temperature around the electric device.

4. The electric device testing apparatus as set forth in any one of claims 1 or 2, comprising:
    an adaptor to which said pusher is fixed;
    a match plate for elastically holding said adaptor; and
    a drive plate having a pushing portion for detachably contacting the upper surface of said adaptor and for moving said pusher in the direction of said connection terminal;
    and wherein:
        said match plate is arranged on said connection terminal changeably in accordance with a kind of the electric device;
        said drive plate is arranged movably upward and downward at the upper portion of said match plate; and
        a first hole formed on said pusher is configured to be connected to a second hole formed on said adaptor, and the second hole formed on said adaptor is configured to be able to connect to a third hole formed on a pushing portion of said drive plate.

5. The electric device testing apparatus as set forth in claim 4, wherein a sealing member for sealing a connection portion of the holes to each other is provided to a contact portion of the pushing portion of said drive plate and said adaptor.

6. The electric device testing apparatus as set forth in claim 1, wherein said temperature adjusted gas supply means includes temperature ventilation amount control means for controlling at least one of the temperature of the temperature adjusted gas and the ventilation amount to be supplied around the electric device based on temperature data from said temperature sensor.

7. The electric device testing apparatus as set forth in claim 1 or 6, wherein said temperature adjusted gas supply means includes dry means for previously drying the temperature adjusted gas to be supplied around the electric device.

8. The electric device testing apparatus as set forth in claim 1 or 6, further comprising a sealed chamber for covering said connection terminal, said pusher and the electric device as one.

9. The electric device testing apparatus as set forth in claim 8, wherein the temperature adjusted gas to be supplied around the electric device from said temperature adjusted gas supply means is an air taken out from a part of the air inside said chamber and being temperature adjusted.

10. The electric device testing apparatus as set forth in claim 2, wherein said drawing means includes drawing amount control means for controlling the drawing amount of air around said electric device during the test on the electric device based on the temperature data from said temperature sensor.

11. The electric device testing apparatus as set forth in claim 2 or 10, further comprising a chamber for maintaining the atmosphere temperature constant around said connection terminal to which the electric device is removably connected.

12. An electric device testing apparatus for performing a test by pushing a terminal of an electric device to be tested against a connection terminal of a heat head, comprising:
    a test tray on which the electric devices to be tested are held and which is carried in the electric device testing apparatus;
    a suction head for picking up the electric device being held on the test tray by sucking the electric device and pushing the terminal of the electric device to be tested against the connection terminal of a test head in the state of sucking the electric device;
    suction force giving means for giving a suction force to said suction head; and
    suction force crushing means for releasing:the suction force of said suction head, the suction force crushing means blows fluid for releasing the suction force of said suction head directly to the electric device pushed against said suction head for any period of time during the test on the electric device in order to adjust a temperature of the electric device which generates heat by itself during a test.

13. The electric device testing apparatus as set forth in claim 12, further comprising a chamber for maintaining the atmosphere temperature constant around said connection terminal.

14. The electric device testing apparatus as set forth in claim 12, wherein a suction surface of said suction head is formed a groove in which the fluid can pass through.

15. The electric device testing apparatus as set forth in claim 12, wherein blowing of the fluid on the electric device is performed by sending an instruction signal from control means to said suction force crush means.

16. The electric device testing apparatus as set forth in claim 12, further comprising a temperature control unit for controlling the fluid to be blown on the electric device to be a predetermined temperature.

17. The electric device testing apparatus as set forth in claim 12, wherein said suction force giving means includes a fluid supply source, an ejector connected to said suction head, an ejector valve comprised by said fluid supply source, said ejector and said suction head.

18. The electric device testing apparatus as set forth in claim 12, wherein said suction force crush means includes a fluid supply source and a crush valve connected to said fluid supply source and said suction head.

19. The electric device testing apparatus as set forth in claim 12, wherein the fluid supply source of said suction force giving means and the fluid supply means of said suction force crush means are identical fluid supply means.

20. The electric device testing apparatus as set forth in claim 12, wherein the fluid to be blown on the electric device is commonly used as fluid applied to said suction force giving means.

21. An electric device sucking apparatus for sucking and releasing an electric device, comprising:

a suction head for sucking up and releasing the electric device;

suction force giving means for giving a suction force to said suction head; and suction force crush means for releasing the suction force of said suction head, the suction force crush means blows fluid on directly on the electric device for releasing the suction force of said suction head in order to adjust a temperature of the electric device which generates heat by itself when the electric device is held at a fixed position.

22. The electric device sucking apparatus as set forth in claim 21, wherein the suction surface of said suction head is formed a groove in which the fluid can pass through.

* * * * *